(12) United States Patent
Yamanouchi et al.

(10) Patent No.: US 6,194,808 B1
(45) Date of Patent: Feb. 27, 2001

(54) SURFACE ACOUSTIC WAVE FUNCTIONAL DEVICE

(75) Inventors: Kazuhiko Yamanouchi, 37-13 Matsugaoka, Taihaku-ku, Sendai-shi, Miyagi 982-0821; Hiroyuki Odagawa, Sendai; Wasuke Sato, Chofu; Naohiro Kuze, Fuji; Hiromasa Goto, Fujinomiya, all of (JP)

(73) Assignees: Kazuhiko Yamanouchi; Asahi Kasei Kogyo Kabushiki Kaisha (JP)

( * ) Notice: Subject to any disclaimer, the term of this patent is extended or adjusted under 35 U.S.C. 154(b) by 0 days.

(21) Appl. No.: 09/230,193
(22) PCT Filed: Jul. 18, 1997
(86) PCT No.: PCT/JP97/02506
§ 371 Date: Jan. 12, 2000
§ 102(e) Date: Jan. 12, 2000
(87) PCT Pub. No.: WO98/04040
PCT Pub. Date: Jan. 29, 1998

(30) Foreign Application Priority Data

Jul. 19, 1996 (JP) .................................... 8-190905
Aug. 17, 1996 (JP) .................................... 8-250778

(51) Int. Cl.$^7$ .................................................. H03H 9/25
(52) U.S. Cl. .................................... 310/313 R; 310/313 D
(58) Field of Search ............................. 310/313 R, 313 D

(56) References Cited

U.S. PATENT DOCUMENTS 3,975,696 * 8/1976 Kantorowicz .................... 310/313 R

FOREIGN PATENT DOCUMENTS

| 2-26118 | 1/1990 | (JP) | H03H/9/72 |
| 6-77556 | 3/1994 | (JP) | H01L/43/06 |
| 8-250974 | 9/1996 | (JP) | H03H/9/72 |
| 8-307203 | 11/1996 | (JP) | H03H/9/72 |

OTHER PUBLICATIONS

K. Yamanouchi et al., "Analysis of strip–coupled SAW amplifier with impedance matching", Japanese Acoustic Conference Lecture Collections II, Spring 1996, 2–9–7, pp. 993–994.

* cited by examiner

Primary Examiner—Thomas M. Dougherty
(74) Attorney, Agent, or Firm—Pennie & Edmonds LLP

(57) ABSTRACT

The surface acoustic wave functional element comprises a semiconductor layer provided on a piezoelectric substrate or a piezoelectric film substrate and makes use of interaction between a surface acoustic wave propagating on the substrate and electrons in the substrate layer, but has the semiconductor layer disposed outside above the propagation path for propagating a surface acoustic wave, comprises a plurality of grating electrodes perpendicularly above and to the propagation path and moreover the semiconductor layer comprises an active layer and a buffer layer lattice-matching thereto. By use of this surface acoustic wave functional element, a surface acoustic wave amplifier capable of providing a high amplification gain at a practical low voltage, a surface acoustic wave convolver having a higher efficiency than ever or the like are offered.

34 Claims, 23 Drawing Sheets

SURFACE ACOUSTIC WAVE FUNCTIONAL DEVICE

TECHNICAL FIELD

The present invention relates to a surface acoustic wave functional element, such as surface acoustic wave amplifier or surface acoustic wave convolver, by use of interaction between a surface acoustic wave propagating through the piezoelectric substrate and electrons in the semiconductor.

BACKGROUND ART

Known as one conventional functional element by use of interaction between a surface acoustic wave and electrons in the semiconductor is a surface acoustic wave functional element of such a structure as to perform an interaction over the propagation path all in width of a surface acoustic wave. With respect to a surface acoustic wave amplifier as one example of surface acoustic wave functional element, for example, three structures have been proposed: direct type amplifier (FIG. 2), separate type amplifier (FIG. 3) and monolithic type amplifier (FIG. 4). The first direct type amplifier is of a structure that a piezoelectric semiconductor substrate 11 such as CdS or GaAs in possession of both piezoelectricity and semiconductivity is used to install thereon an input electrode 4, an output electrode 5 and an electrode 8 for applying a DC electric field to the piezoelectric semiconductor substrate 11, thereby amplifying a surface acoustic wave. However, no piezoelectric semiconductor in possession of both large piezoelectricity and large electron mobility has been found thus far. The second separate type amplifier is an amplifier of a structure with an input electrode 4 and an output electrode 5 provided on a piezoelectric substrate 1 of a large piezoelectricity and a semiconductor 12 of a large electron mobility disposed via a gap 13 as well. In this type of amplifiers, the amplification gain is largely affected by the flatness of the surface of the semiconductor and the piezoelectric substrate and by the magnitude of the gap. To obtain the amplification gain equal to practical use, it is required to make the gap as small as possible and keep it constant all over the operating region, so that there is an extreme difficulty in industrial production. On the other hand, the third monolithic type amplifier is an amplifier of a structure with an input electrode 4 and an output electrode 5 provided on a piezoelectric substrate 1 and a semiconductor 12 formed via a dielectric layer 14 rather than a gap 13 as well. According to 1970s studies by Yamanouchi and others (K. Yamanouchi et al., Proceedings of the IEEE, 75, p. 726 (1975)), an electron mobility for InSb of 1600 $cm^2/Vs$ has been obtained in a structure with SiO coated onto the $LiNbO_3$ substrate and a 50 nm thick InSb film deposited thereon and a gain of 40 dB has been obtained at a central frequency of 195 MHz under application of an extremely high DC voltage of 1100 V in a surface acoustic wave amplifier using this film. Since no good film quality of InSb was obtained, however, there has been a problem of too high driving voltage and too small amplification gain at a low voltage in consideration of applications to an actual portable apparatus.

Next, a surface acoustic wave convolver can be referred to as another application by use of interaction between a surface acoustic wave and electrons in a semiconductor. At present, surface acoustic wave convolvers arrest attention greatly as correlators for CDMA (Code Division Multiple Access) scheme of spread spectral communication. Since former times, digital LSI and analog LSI have been examined as CDMA correlators, but either of them was extremely large in power consumption, thus forming an extremely large barrier against applications to a handy device requiring a low power consumption. Thus, a surface acoustic wave convolver of zero consumed power in principle begins to be examined to practical use with advantages taken of low power consumption and no need for synchronism. In studies of a surface acoustic wave convolver, a convolution output of −59 dBm has been obtained at the system of InSb/$LiNbO_3$, for example according to K. Yamanouchi, S. Mitsui and K. Shibayama, IEEE MTT-S Intern. Microwave Symp. Digest, p. 31 (1980).

To ensure applicabilities of a monolithic type amplifier to actual portable telephone or the like, however, it is required to obtain a better amplification gain at a practically low voltage of at least 9 V or lower and to implement it in a feasible process as well. In other words, a lower voltage than the former technique by two factors or more must be intended. Besides, as regards a surface acoustic wave convolver, a still greater efficiency must be attained.

In a former structure of surface acoustic wave functional elements, it has been required to lessen the thickness of a semiconductor film greatly in using such a semiconductor as InSb of a large electron mobility to match the electric impedance of a surface acoustic wave with that of the semiconductor. With a thin film thickness, however, the semiconductor film is poor in crystallinity and becomes smaller in electron mobility, so that no functional element better in characteristics has been obtained.

Besides, in convolvers, because of a small thickness of the semiconductor layer, there has been a problem for a method of taking out an output in a direction of thickness that no high efficiency is obtained and moreover a problem that the sheet resistance reduces, thus leading to a short circuit in the electric field of a surface acoustic wave has occurred for a greater thickness of the semiconductor layer. Furthermore, in a structure of forming a semiconductor layer above the propagation path, the loss of a surface acoustic wave has increased, thus causing a decrease in amplification gain and a lowering of efficiency.

Still further, no attention whatever has been paid to the presence of a buffer layer, the position of a grounded electrode and interaction in shape of a strip electrode.

DISCLOSURE OF THE INVENTION

It is one object of the present invention to provide a surface acoustic wave functional element easy of industrial production, having a semiconductor film good in film quality as the active layer with the semiconductor so arranged that an interaction between a surface acoustic wave and the semiconductor occurs sufficiently.

As a result of intensive examination for solving the above task, the inventors implemented a surface acoustic wave amplifier of great amplification characteristics and a surface acoustic wave convolver of an extremely high efficiency under a low voltage wherein the semiconductor layer was improved in crystallinity by inserting between the piezoelectric substrate and an active layer a buffer layer lattice-matched to the active layer and further an interaction is enabled to occur in the semiconductor layer by disposing a semiconductor layer beside the propagation path and using a grating electrode to convey the electric field of a surface acoustic wave to the semiconductor layer.

An extremely great amplification characteristic and an extremely high efficiency of convolution output under low voltage was implemented in the present invention 1) because an extremely good active layer could be formed on the piezoelectric substrate by inserting a buffer layer in the growth of a semiconductor layer, 2) because the absence of a semiconductor layer on the propagation path of the piezoelectric substrate could minimize the loss of a surface acoustic wave, 3) because the electrode width and the electrode interval in grating electrodes disposed on the propagation path were selected so as to suppress the reflection and 4) because the efficiency of interaction between a surface acoustic wave and electrons could be improved by the formation of an output electrode alternating the grating electrode for an electric surface wave convolver.

Here, the active layer means a layer in which electrons to interact with the surface acoustic wave propagated.

By properly selecting the relatively positional relation among the semiconductor layer (active layer) improved in film quality as a result of such insertion of a buffer layer, the grating electrode and the output electrode, the above object was attained.

Namely, 1) a surface acoustic wave functional element according to the present invention comprises an input electrode, an output electrode and a semiconductor layer provided on the piezoelectric substrate wherein the above semiconductor layer is situated outside above the propagation path of a surface acoustic wave propagated from the input electrode, the semiconductor layer is composed of an active layer and a buffer layer aligned thereto, and further comprises a plurality of grating electrodes placed on the above propagation path perpendicularly to the propagation direction and in a greater width than that of the propagation path.

2) In the 1) mentioned above, one-end portions of the above rating electrodes may be formed on the above semiconductor layer.

3) In the 1) or 2) mentioned above, the functional element may comprise a plurality of grating electrodes with their width L satisfying L=λ/3n (n: positive integer) and their inter-electrode space S satisfying S=λ/3n (n: positive integer) for the wavelength λ of a surface acoustic wave propagating through the above propagation path.

4) In the 3) mentioned above, it is preferable that the width L of the above grating electrodes satisfies λ/8≦L≦λ and the space S satisfies λ/8≦S≦λ.

5) In the 3) mentioned above, it is preferable that the width L of the above grating electrodes satisfies L=λ/6 and the inter-electrode space S satisfies λ/6.

6) The surface acoustic wave functional element described in any of the above 1) to 5), may further comprise an electrode for applying a DC electric field to the above semiconductor layer.

7) The surface acoustic wave functional element described in any of the above 1) to 5), is characterized in that two input signals propagating from a reference signal input electrode and the above input electrode is subjected to convolution with the above output electrode employed for the reference signal input electrode.

8) In the above 7), the functional element may comprise an output electrode so arranged as to cross the above grating electrode and become equal in potential thereto.

9) In the above 8), the above output electrode may be formed above the semiconductor layer.

10) In the above 8), the above output electrode may be formed below the semiconductor layer.

11) In any of the above 7) to 9), the functional element may comprise a uniform output electrode at the bottom of the above semiconductor layer.

12) In any of the above 7) to 11), the functional element may comprise a uniform ground connection output electrode at the bottom of the above piezoelectric substrate.

13) In any of the above 8) to 12), a grating electrode above the propagation path may differ in electrode period from a grating electrode formed in alternating above or below the semiconductor layer and the output electrode.

14) Besides, the surface acoustic wave functional element of the present invention, comprising a grating electrode and a semiconductor layer provided on a piezoelectric substrate or on a piezoelectric film substrate, is characterized in that the above semiconductor layer is situated outside above the propagation path for a surface acoustic wave propagating, a plurality of grating electrodes are formed perpendicularly to the propagating direction above the semiconductor layer, a strip dielectric film is formed at the top of grating electrodes in other part than the semiconductor layer and an output electrode is formed on the relevant dielectric film.

15) In the above 14), the above strip dielectric films may be formed at the top and the bottom of the grating electrode.

16) In the above 15), an output electrode may be formed below the strip dielectric film formed at the bottom of the above grating electrode.

17) In any of the above 14) to 16), a uniform output electrode may be formed at the bottom of the above semiconductor layer.

18) In any of the above 14) to 16), the above grating electrode may be formed below the semiconductor layer.

19) In the above 18), a uniform output electrode may be formed at the top of the above semiconductor layer.

20) In the above 14) to 19), the above grating electrodes have a structure of lengths in width alternately varied in an appropriate combination and a strip dielectric film may be formed at respective one ends of alternate grating electrodes.

21) In the above 14) to 19), output electrodes are formed so as to cross the above grating electrodes and may be connected so as to become the same potential.

22) Furthermore, the surface acoustic wave functional element of the present invention, comprising a semiconductor layer, grating electrodes and an output electrodes provided on a piezoelectric substrate or on a piezoelectric film substrate, is characterized in that the above semiconductor layer is situated outside above the propagation path for a surface acoustic wave propagating, a plurality of grating electrodes are formed perpendicularly to the propagating direction above the semiconductor layer, the above output electrodes are formed across the above grating electrodes so as to become the same potential and ground output electrodes, formed in a narrower width than that of the propagation path on and across the grating electrode portions opposed to the above semiconductor layer, are connected to a common electrode.

23) In the above 22), the above grating electrodes and the above output electrodes may be formed below the semiconductor layer.

24) In any of the above 21) to 23), the above output electrodes may be formed over the semiconductor layer part to the propagation path.

25) The surface acoustic wave functional element of the present invention, comprising a semiconductor layer, grating electrodes and an output electrodes provided on a piezoelectric substrate or on a piezoelectric film substrate, is characterized in that the above grating electrodes are formed up to halfway on the top or bottom of the semiconductor layer and a uniform output electrode having a gap with the ends of the above grating electrodes is formed.

26) The surface acoustic wave functional element described in any of the above 14) to 25), is characterized in that the grating electrodes above the propagation path differ in electrode period from those formed above or below the semiconductor layer, or above or below the ground output electrode part or the strip dielectric film.

27) In any of the above 14) to 26), it is preferable that the width L of the above grating electrodes satisfies $\lambda/8 \leq L \leq \lambda$ and the space S between the grating electrodes satisfies $\lambda/8 \leq S \leq \lambda$.

28) In any of the above 21) to 26), it is preferable that the electrode width L of the alternating portion of the above grating electrodes with an output electrode or a ground output electrode satisfies $\lambda/16 \leq L \leq \lambda/2$ and the inter-electrode space S satisfies $\lambda/16 \leq S \leq \lambda/2$.

29) In any of the above 14) to 29), it is preferable that the width L of the above grating electrodes is $\lambda/6$ and the space S between the grating electrodes is $\lambda/6$.

30) In any of the above 14) to 26), the above semiconductor layer may be composed of an active layer and a buffer layer lattice-matching thereto.

31) In any of the above 1) to 30), the ratio of the width W of the propagation path for a surface acoustic wave to the width a of the semiconductor layer is preferably determined in such a manner as to almost equate the electric wave impedance of a surface acoustic wave to that of the semiconductor layer.

32) With the surface acoustic wave functional element described in any of the above 1) to 31), the ratio of the width W of the above propagation path to the width a of the above semiconductor layer preferably satisfies W/a>1.

33) With the surface acoustic wave functional element described in any of the above 1) to 32), the ratio of the width W of the above propagation path to the width a of the above semiconductor layer preferably satisfies W/a=8–10.

34) With the surface acoustic wave functional element described in any of the above 14) to 33), a semiconductor selected from a group comprising Si, InAs, InSb, GaAs and InP may be employed for a semiconductor layer.

35) With the surface acoustic wave functional element described in any of the above 1) to 34), a substrate selected from a group comprising $LiNbO_3$ single-crystal substrate, $LiTaO_3$ single-crystal substrate and $KNbO_3$ single-crystal substrate may be employed for the above piezoelectric substrate.

36) With the surface acoustic wave functional element described in any of the above 1) to 34), a piezoelectric film substrate formed using a film selected from a group comprising $LiNbO_3$ film, $LiTaO_3$ film, $KNbO_3$ film, PZT film and $PbTiO_3$ film may be employed for the above piezoelectric substrate.

BEST MODE FOR CARRYING OUT THE INVENTION

Figure 1:
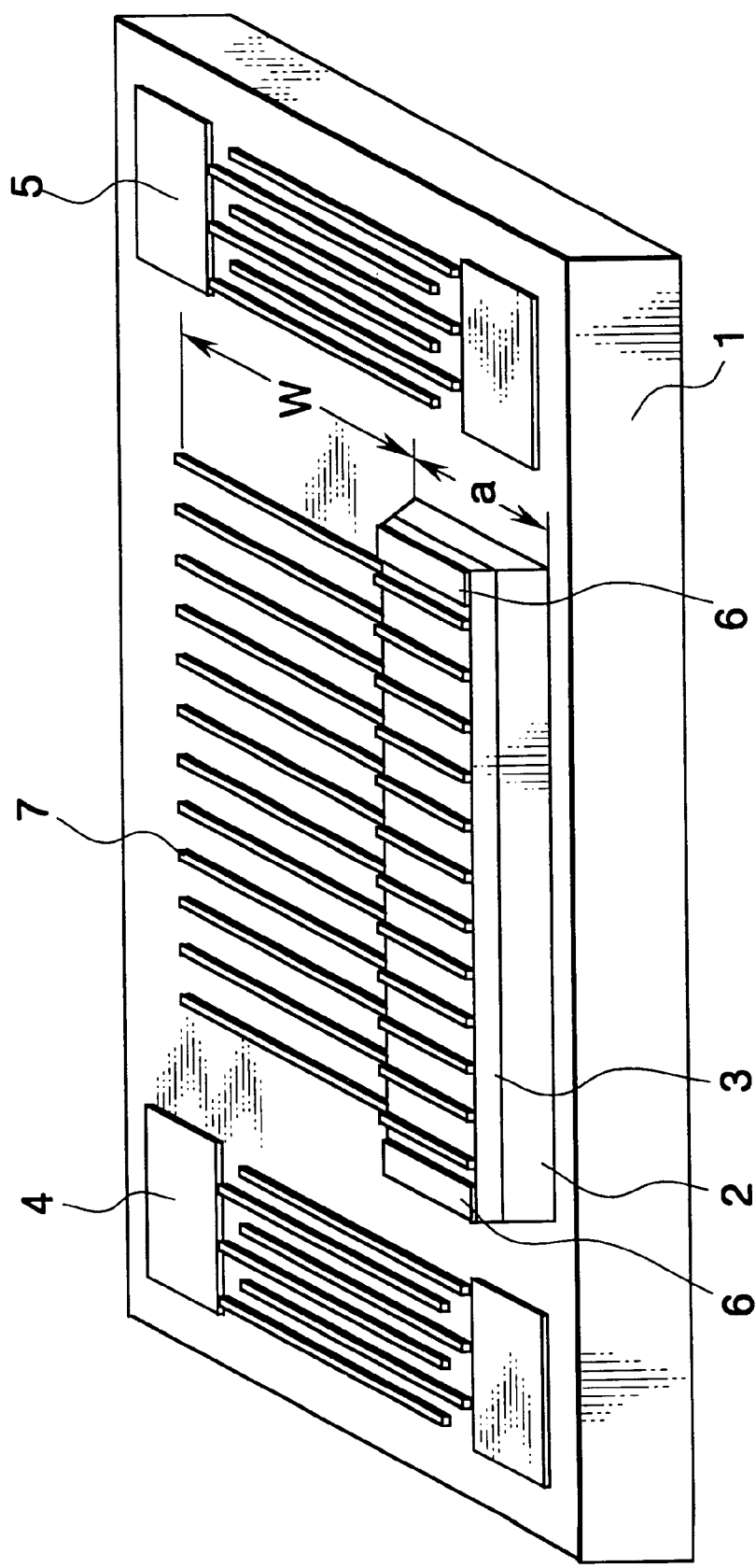
FIG. 1 is a schematic perspective view of a surface acoustic wave functional element according to one embodiment of the present invention.

Hereinafter, the present invention will be described in further detail. FIG. 1 shows a surface acoustic wave element on which the present invention centers, comprising a piezoelectric substrate 1, a buffer layer 2, an active layer 3, an input electrode 4, an output electrode 5, an electrode 6 for applying a DC electric field to a semiconductor and a grating electrode 7.

A piezoelectric substrate according to the present invention may be a single-crystalline substrate of piezoelectrics or those with a piezoelectric film formed on the substrate. To acquire a better performance in the surface acoustic wave functional element of the present invention, it is preferred to use a piezoelectric substrate greater in electro-mechanical coupling coefficient. For single-crystalline substrate of piezoelectrics, an oxide piezoelectric substrate, such as $LiNbO_3$, $LiTaO_3$, $Li_2B_4O_7$ or $KNbO_3$, is preferably used. Besides, it is preferred to use a substrate of cut plane, such as 64 degree Y cut, 41 degree Y cut, 128 degree Y cut, Y cut, X cut or Z cut of $LiNbO_3$ or 36 degree Y cut of $LiTaO_3$. Piezoelectric film substrates are those with a piezoelectric film formed on a single-crystalline substrate of sapphire, Si, GaAs or the like, while examples of thin-film materials used preferably for piezoelectric film are ZnO, $LiNbO_3$, $LiTaO_3$, $KNbO_3$, PZT, $PbTiO_3$, $BaTiO_3$ and $Li_2B_4O_7$. Besides, a dielectric film of SiO, $SiO_2$ or the like may be inserted between a single-crystalline substrate of sapphire, Si, GaAs or the like and the above piezoelectric film. Furthermore, as a piezoelectric film substrate, a multilayered film like films of different sorts among the above piezoelectric films stacked over each other may be formed on a single-crystalline substrate of sapphire, Si, GaAs or the like. For example, a multilayered film made up of $LiNbO_3$ and $LiTaO_3$ is a preferred example.

For active layers, those of a large electron mobility are preferably used to promote the performance of a surface acoustic wave functional element. Preferred examples include GaAs, InSb, InAs and PbTe. Besides, not only binary systems but ternary or quaternary mixed crystals made of combinations thereof are preferably used. For example, $In_xGa_{1-x}As$, $In_xGa_{1-x}Sb$, $InAs_ySb_{1-y}$ and $GaAs_ySb_{1-y}$ are examples of ternary mixed crystals, while $In_xGa_{1-x}As_ySb_{1-y}$ is an example of quaternary mixed crystal. To acquire a high electron mobility of active layers, as regards x in $In_xGa_{1-x}M$ (M: V group semiconductor such as As or Sb) as the composition of active layers, a high electron mobility is obtainable generally within $0 \leq x \leq 1.0$, but $0.5 \leq x \leq 1.0$ is preferable and $0.8 \leq x \leq 1.0$ is a more preferred range. As regards y in $RAs_ySb_{1-y}$ (R: III group semiconductor such as In or Ga), a higher electron mobility is obtainable within a range of $0 \leq y \leq 1.0$ and $0 \leq y \leq 0.5$ is preferable.

Besides, the thickness hi of an active layer is preferably 5 $\mu$m or less, more preferably 1 $\mu$m or less and still more preferably 0.8 $\mu$m or less to implement a low carrier density of the active layer and allow a surface acoustic wave and electrons to efficiently interact with each other and moreover to prevent the breaking of wire in a grating electrode in the case of forming the grating electrode on the semiconductor layer. Besides, a value of resistance in the active layer is preferably 10 $\Omega$ or higher, more preferably 50 $\Omega$ or higher and still more preferably 100 $\Omega$ or higher.

The piezoelectric substrate and the active layer are quite different both in crystal structure and in lattice constant from each other. For example, $LiNbO_3$ of the piezoelectric substrate is of trigonal system, whereas InSb of the active layer is of zinc blend system. The lattice constant also differs by more than 25%. In consequence, even if an attempt is made to allow InSb to grow on the $LiNbO_3$ substrate as it stands, many defects appear and no good film quality is obtained. Thus, the present invention found that use of a compound semiconductor identical in crystal structure and relatively near in lattice constant to InSb as a buffer layer permits an active layer good in film quality to be implemented. Furthermore, the buffer layer of the present invention is characterized in having a high resistance and forming no current leakage layer in the interface with the piezoelectric substrate. Besides, in the buffer layer of the present invention, the electric field of a surface acoustic wave was found to be characterized in hardly attenuating. Furthermore, from the viewpoint of crystal growth technology, the compound semiconductor constituting the buffer layer of the present invention was confirmed to be extremely rapid in crystal relaxation and to begin to grow in a slight thickness at a structure and lattice constant peculiar to the relevant compound semiconductor, thus permitting an underlayer for nuclear formation of the active layer to form.

As buffer layers according to the present invention, binary systems such as AlSb, ZnTe and CdTe and ternary systems such as AlGaSb, AlAsSb and AlInSb and quaternary systems such as AlGaAsSb, AlInAsSb, AlInGaSb, AlInPSb and AlGaPSb are preferred examples. Furthermore, in determining the composition of the above buffer layers of ternary systems or greater, a larger electron mobility of active layer can be implemented by adjustment to a composition identical or near in lattice constant to the crystal constituting the active layer. The lattice matching referred to as in the present invention indicates the same in crystal structure and the nearness in lattice constant. Here, the nearness in lattice constant means that the difference in lattice constant between the crystal constituting an active layer and that constituting a buffer layer is within ±10%, preferably within ±7% and more preferably within ±5%. Besides, for a more efficient interaction between a surface acoustic wave and electrons, the smaller thickness of the buffer layer becomes the better. Namely, the thickness h2 of the buffer layer ranges preferably 5 nm≦h2≦3000 nm, more preferably 10 nm≦h2≦2000 nm and still more preferably 20 nm≦h2≦1000 nm. Besides, the above buffer layer must be electrically insulated from electrons in the active layer. Namely, it is advisable that the resistance of the buffer layer is made at least 5–10 times larger, preferably 100 times larger and more preferably 1000 times larger than that of the active layer.

Besides, the buffer layer of the present invention may be a multilayer of two types or more of semiconductor films.

In the case of a multilayer of two types or more of buffer layers, since it is necessary that only the buffer layer in contact with the active layer is high in resistance, such conductive materials as InSb or GaAsSb also can be employed for the buffer layer except the above examples of buffer layers. Besides, two sorts of buffer layers among the above buffer layers may be alternately stacked to make a super lattice structure. It contributes to the promotion of film characteristics in the active buffer layer that the top layer among the buffer layers stacked with two sorts or more of films is made near in lattice constant to the active layer. Besides, as with the conditions of the above buffer layer, the smaller the thickness of a multilayered buffer layer is, the more advantageous for preventing the wire breaking of the grating electrode.

In the present invention, a dielectric layer may be inserted between the piezoelectric substrate and the buffer layer. This dielectric layer is used in some cases to protect the piezoelectric substrate and the semiconductor film formed thereon. Examples used for the dielectric layer are SiO, $SiO_2$, silicon nitride, $CeO_2$, $CaF_2$, $BaF_2$, $SrF_2$, $TiO_2$, $Y_2O_3$, $ZrO_2$, MgO, $Al_2O_3$ and $Ta_2O_5$. The dielectric layer becomes the better for the smaller and is preferably 200 nm thick or less and more preferably 100 nm thick or less.

For the strip dielectric film of the present invention, materials of the above dielectric layer can be employed similarly. Incidentally, the strip dielectric film is formed for an efficient takeout of convolution output. Namely, the convolution output due to an interaction between a surface acoustic wave and electrons in the semiconductor layer and the convolution output above the propagation path are enabled to be added together via the grating electrode.

With respect to materials of an electrode on the piezoelectric substrate and a grating electrode above the propagation path, there is in particular no restriction, but electrodes of Al, Au, Pt, Cu, Al-Ti alloy, Al-Cu alloy and a multilayered electrode of Al and Ti, for example, are preferably employed.

With respect to materials used in electrodes for application of a DC electric field to the semiconductor layer, there is in particular no restriction, but Al, Au, Ni/Au, Ti/Au, Cu/Ni/Au and AuGe/Ni/Au are preferably employed.

A surface acoustic wave propagating through the propagation path is normally reflected from the grating electrode, but minimizing this reflection also leads to an improvement in amplification gain and efficiency. Thus, the grating electrode of the present invention is formed at an electrode width and electrode space as efficiently conveying the electric field of a surface acoustic wave to the semiconductor layer and minimizing the reflection. Namely, the electrode width L and the electrode space S in the grating electrode of the present invention are set preferably to not smaller than $\lambda/8$ and not greater than $\lambda$ for the wavelength $\lambda$ of a surface acoustic wave. Furthermore, to minimize the attenuation of the surface acoustic wave due to the reflection from the grating electrode, it is set preferably to $\lambda/3n$ or $\lambda/2n$ (n: positive integer). Since with an excess of increase in n, a fine patterning process of the electrode becomes difficult, n is set preferably to 8 or smaller.

Besides, in consideration of attenuation due to the reflection and an easiness of electrode patterning technique, the electrode width L and the electrode space S in the grating electrode of the present invention are set still more preferably to $\lambda/6$. Besides, at the output electrode above or below the semiconductor layer or in the alternating portion of a ground output electrode over the grating electrode outside the semiconductor layer, the above electrode width and electrode space are preferably made to further a half of it or less. Namely, the electrode width L and the space S between electrodes in the alternating portion of the above grating electrode with the above output electrode and the above ground output electrode are preferably $\lambda/16 \leq L \leq \lambda/2$ and $\lambda/16 \leq S \leq \lambda/2$, respectively. For example, on setting the grating electrode width and electrode space to $\lambda/6$ above the propagation path, the electrode width and electrode space becomes $\lambda/12$ in the alternating portion of the grating electrode and the output electrode on the semiconductor layer. Incidentally, as regards the arrangement of the alternating portion, the alternating portion of the output electrode and the grating electrode are crossed preferably over all the semiconductor surface on the top face of the semiconductor layer.

Besides, the alternating width of the output electrode and the grating electrode is preferably narrower than the width of the propagation path outside above the propagation path and is set more preferably to $3\lambda$. The wavelength $\lambda$ of a surface acoustic wave is expressed in terms of $\lambda=v/f$ (v: velocity of a surface acoustic wave, and f: frequency) and since the velocity v is publicly known for individual piezoelectric substrate materials, the width and electrode space of the grating electrode can be determined to a desired value, e.g., so as to satisfy $\lambda/3n$ or $\lambda/2n$, corresponding to a frequency to be used.

The grating electrode of the present invention can be formed on the top or bottom of the semiconductor layer. In view of the crystallinity of the semiconductor layer, the more semiconductor film grows, the higher the crystallinity becomes. In other words, according as going to the top, the electron mobility increases. Accordingly, to raise the efficiency of interaction between a surface acoustic wave and electrons, it is preferable to allow interaction to occur at the top face of the semiconductor layer.

In the present invention, formation of an output electrode and a ground output electrode across the grating electrode made it possible to take out the convolution output in a lateral direction but not in vertical direction of the semiconductor layer. As a result of this, the motion of electrons flows in a lateral direction in proportion to the size of the depletion layer formed by the grating electrode, so that an effect of enlarging the film thickness was implemented without reducing the resistance of the semiconductor layer.

Furthermore, by optimizing the electrode period of the alternating position or alternating portion of the grating electrode with the output electrode or the ground output electrode, a convolver has also attained a higher efficiency than ever.

Besides, the width W of the propagation path for a surface acoustic wave and the width a of the semiconductor film can be selected to an appropriate value, but matching the total resistance of the semiconductor layer section and the grating electrode section to the surface impedance of a surface acoustic wave enables the efficiency of interaction between the surface acoustic wave and electrons to be improved. The total resistance value of the semiconductor layer section and the grating electrode section can be changed depending on the ratio W/a of the width W of the propagation path to that a of the semiconductor layer. To acquire a higher efficiency, it is preferable to set W/a to more than 1 and more preferable to match the total resistance of the semiconductor layer section and the grating electrode section to the surface impedance of a surface acoustic wave. Empirically, a matching is easily made near W/a=8–10.

Forming of the buffer layer and the active layer of the present invention may be performed by any method, if it is a method for allowing a thin film to grow generally. For example, the evaporation process, the molecular beam epitaxy (MBE) process, the metalorganic molecular beam epitaxy (MOMBE) process and the metalorganic vapor phase deposition (MOCVD) process are especially preferred methods.

EXAMPLES

Referring now to specific examples, the present invention is described below. However, the present invention is not limited to these examples. Using unidirectional electrodes to produce surface acoustic wave functional elements as practical devices makes it possible to reduce losses due to bidirectionality of surface acoustic waves.

Example 1

Figure 5:
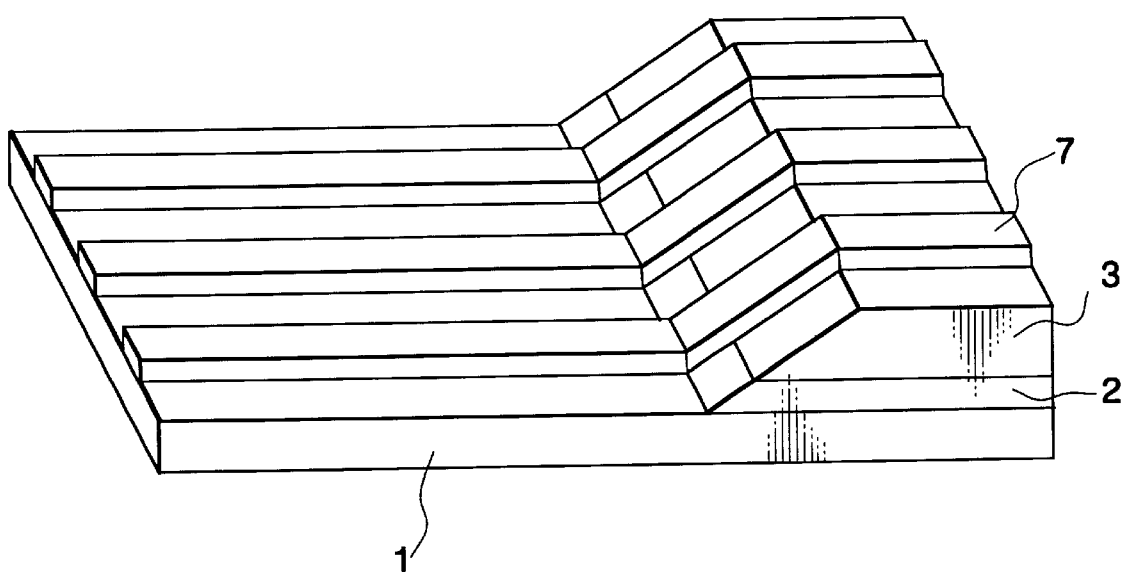
FIG. 5 is a schematic perspective view showing the enlarged semiconductor layer and grating electrode section of a surface acoustic wave functional element, comprising a semiconductor layer, composed of a buffer layer and an active layer, and grating electrodes, according to one embodiment of the present invention.

On a piezoelectric substrate 1, as a 128° Y-cut LiNbO$_3$ single-crystal substrate three inches in diameter, a buffer layer 2 of Al$_{0.5}$Ga$_{0.5}$AsSb was grown to a thickness of 50 nm by the MBE method, and then an active layer 3 of InSb was grown to a thickness of 500 nm. When electrical characteristics of the active layer were measured by the Van der Pauw method, its carrier density and electron mobility were found to be n$_o$=1.7×10$^{16}$/cm$^3$ and $\mu$=33400 cm$^2$/Vs, respectively. Then as shown in FIG. 1, the buffer layer 2 and active layer 3 were etched by photolithography to be strips with a width of a so that the layers were only outside a propagation path for surface acoustic waves (its width is denoted by W). Next, the lift-off process was used to form grating electrodes 7, extending across the propagation path for surface acoustic waves and the active layer 3; a cascade input electrode 4 for surface acoustic waves; a cascade output electrode 5; and an electrode 6 for applying a direct-current electric field to the active layer 3. The grating electrodes 7 were provided, with the width L thereof being 0.5 µm, the spacing between the grating electrodes being 0.5 µm, and the ratio of propagation path width to semiconductor layer width (W/a) being 10 (W=263 µm and a=26.3 µm). FIG. 1 shows the structure of a surface acoustic wave amplifier produced through the process described above. FIG. 5 is an enlarged schematic view of the grating electrodes on the propagation path and semiconductor layer. When amplification characteristics were measured at 1520 MHz using a network analyzer (8510B from Yokokawa Hewlett Packard), with a voltage of 3 V applied to the electrode 6, the amplification gain, that is, difference between gain after an electric field is applied and insertion loss before the electric field is applied, was found to be 29 dB. The value of L and that of S were $\lambda$/6.

Comparative Example 1

By the MBE method, InSb film was grown to a thickness of 500 nm on a piezoelectric substrate 1, or a 128° Y-cut LiNbO$_3$ single-crystal substrate three inches in diameter. When electrical characteristics of the InSb film were measured at room temperature, its carrier density and electron mobility were found to be n$_o$=2.0×10$^{16}$/cm$^3$ and $\mu$=6500 cm$^2$/Vs, respectively. Then when the amplification gain was measured using a surface acoustic wave amplifier, made in the same way as in the case of Example 1, no amplification was observed at as low as three volts. That is, since no buffer layer was available in Comparative example 1, InSb film quality was not improved, so that electron mobility decreased. Diffusion of Li and O atoms from the LiNbO$_3$ substrate deteriorated InSb film quality because the InSb layer was grown directly on the LiNbO$_3$ layer. In addition, a current leak layer was formed at the interface between the piezoelectric substrate and the InSb layer. The current leak layer is considered to have caused amplification performance to deteriorate. The AlGaAsSb buffer layer used in Example 1 is found to increase crystalinity by placing InSb, crystal structure, and lattice constant close to each other and prevent diffusion of Li and O atoms from an LiNbO$_3$ substrate.

Comparative Example 2

Figure 6:
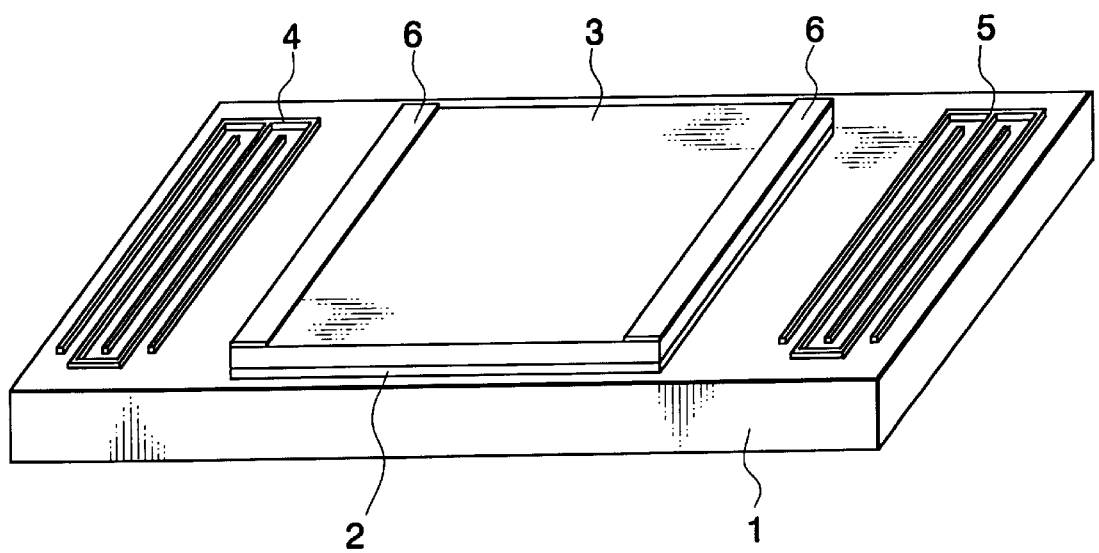
FIG. 6 is a schematic perspective view of a former surface acoustic wave amplifier of a structure with a semiconductor layer provided above a propagation path.

Using a 128° Y-cut LiNbO$_3$ single-crystal substrate three inches in diameter as a piezoelectric substrate 1, a buffer layer and an active layer were grown in the same way as in the case of Example 1. Then the buffer layer 2 and active layer 3 were etched by photolithography so that a semiconductor layer is positioned on a propagation path for surface acoustic waves. Next, the lift-off method was used as in the case of Example 1 to form an input electrode 4, an output electrode 5, and an electrode 6 for applying a direct-current electric field to the semiconductor layer. FIG. 6 is a schematic view of Comparative example 2. When the amplification characteristics of a surface acoustic wave amplifier produced through the process described above were measured at 1520 MHz, with a voltage of 3 V applied to the semiconductor layer of the amplifier, no amplification was observed. In this comparative example, surface acoustic waves must be generated through the buffer layer and active layer, which formed thick, to cause interaction between surface acoustic waves and electrons in the semiconductor layer. In Comparative example 2, the active layer was so thick, at 500 nm that the interaction was inefficient.

Example 2

Figure 7:
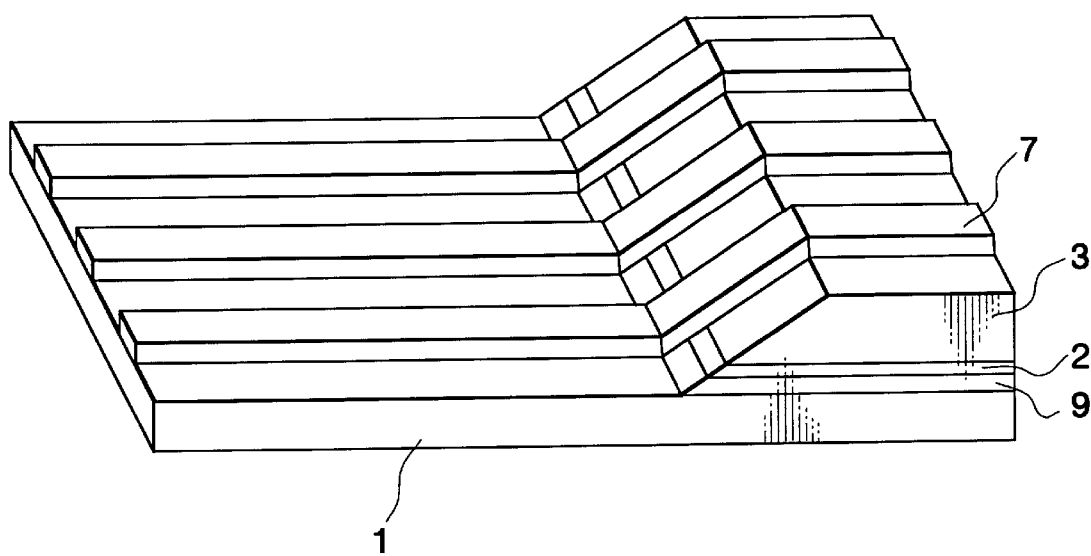
FIG. 7 is a schematic perspective view of the semiconductor layer, the dielectric layer and the grating electrode section in an enlarged illustration of a surface acoustic wave functional element with a dielectric layer inserted between the buffer layer and the piezoelectric substrate, according to one embodiment of the present invention.

On a piezoelectric substrate 1, as a 128° Y-cut LiNbO$_3$ single-crystal substrate three inches in diameter, SiO$_2$ film 9 30 nm thick was formed by the sputtering method, then an Al$_{0.5}$Ga$_{0.5}$AsSb film was grown to a thickness of 50 nm as a buffer layer 2 by the MBE method, and next, InSb film, that is, an active layer 3, was grown to a thickness of 500 nm. When the electrical characteristics of the active layer were measured in the same way as in the case of Example 1, its carrier density and electron mobility were found to be n$_o$=1.8×10$^{16}$/cm$^3$ and $\mu$=31400 cm$^2$/Vs, respectively. Then through the same process as in the case of Example 1, a surface acoustic wave amplifier having the same structure as the amplifier in FIG. 1 was made, with L, S, and W/a set to 0.7 µm, 0.7 µm, and 10, respectively (W=400 µm and a=40 µm). The values of L and S were equal to λ/6. FIG. 7 is an enlarged schematic view of the propagation path and grating electrodes. When amplification characteristics were measured at 1 GHz, with a voltage of 5 V applied to the electrode 6, amplification is found to correspond to 28.8 dB. This in turn means that a large amplification gain is provided even if $SiO_2$ film is formed on a piezoelectric substrate.

Comparative Example 3

As in the case of Example 2, on a piezoelectric substrate 1, as a 128° Y-cut $LiNbO_3$ single-crystal substrate three inches in diameter, $SiO_2$ film was formed to a thickness of 30 nm, and then InSb film was formed to a thickness of 500 nm by the MBE method. The electron mobility of the InSb film was µ=5900 $cm^2$/Vs. It was determined that inserting a buffer layer of AlGaAsSb causes electron mobility to significantly increase. When a surface acoustic wave amplifier, made through the same process as in the case of Example 1, was used to measure amplification characteristics in the same way as in the case of Example 2, no amplification was observed. In Comparative example 3, the $SiO_2$ layer made it possible to inhibit Li and O atoms from diffusing from the piezoelectric substrate. However, because the InSb film was grown directly on an amorphous $SiO_2$ layer, its quality was so low that no amplification was observed at practically low voltages. A comparison with Example 2 has shown that inserting a buffer layer of AlGaAsSb markedly increases electron mobility.

Example 3

On a piezoelectric substrate 1, as a 64° Y-cut $LiNbO_3$ single-crystal substrate three inches in diameter, a buffer layer 2 of $Al_{0.5}Ga_{0.5}AsSb$ was grown to a thickness of 50 nm, and then an active layer 3 of InSb was grown to a thickness of 500 nm by the MBE method. When electrical characteristics of the active layer were measured in the same way as in the case of Example 1, its carrier density and electron mobility were found to be $n_o=1.7\times10^{16}/cm^3$ and µ=33000 $cm^2$/Vs, respectively. Next, through the same process as in the case of Example 1, a surface acoustic wave amplifier having the same structure as in FIG. 1 was made, with L, S, and λ/6 set to 0.75 µm and W/a set to 10 (W=300 µm and a=30 µm). When a voltage of 3 V was applied to the electrodes for applying a direct-current electric field which were formed at both ends of the semiconductor, an amplification gain of 35 dB was observed at 1 GHz. This indicates that selecting the best piezoelectric substrate material increases amplification.

Example 4

Figure 8:
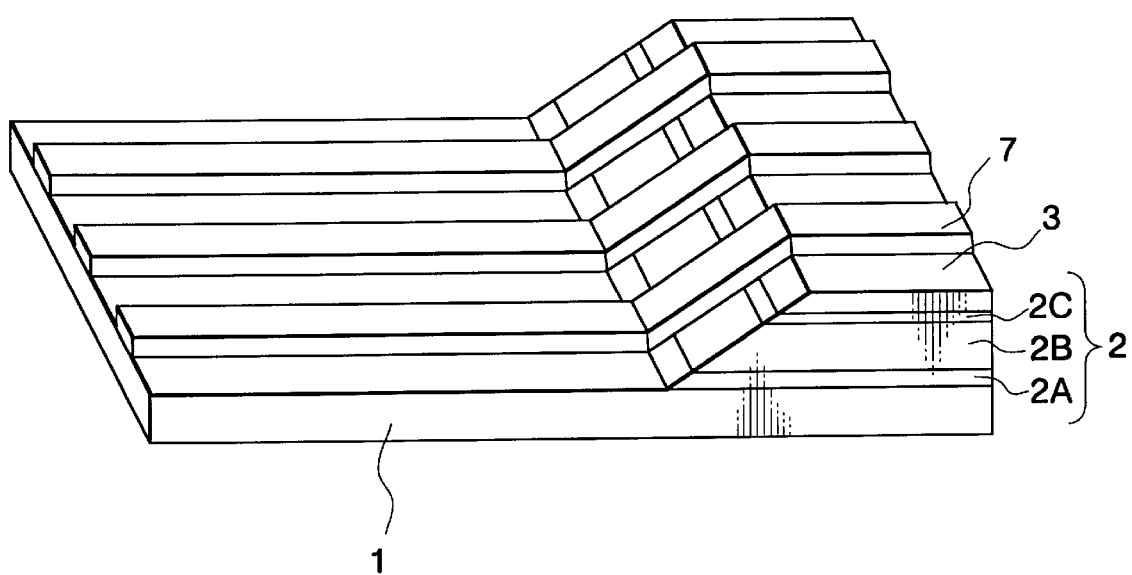
FIG. 8 is a schematic perspective view of the semiconductor layer and the grating electrode section in an enlarged illustration of a surface acoustic wave functional element with three buffer layers, according to one embodiment of the present invention.

On a piezoelectric substrate 1, as a 128° Y-cut $LiNbO_3$ single-crystal substrate three inches in diameter, a first buffer layer 2A of $Al_{0.5}Ga_{0.5}AsSb$ was grown to a thickness of 50 nm by the MBE method. Then on the buffer layer, a second buffer layer 2B of InSb 200 nm thick and a third buffer layer 2C of $Al_{0.5}In_{0.5}Sb$ 100 nm thick were deposited one on top of the other in that order. Next, on the buffer layers, an active layer 3 of InSb was grown to a thickness of 200 nm. When electrical characteristics of the active layer were measured in the same way as in the case of Example 1, its carrier density and electron mobility were found to be $n_o=1.5\times10^{16}/cm^3$ and µ=34800 $cm^2$/Vs. Then through the same process as in the case of Example 1, a surface acoustic wave amplifier having the same structure as in FIG. 1 was made, with L, S, and λ/6 set to 0.7 µm and W/a set to 8 (W=400 µm and a=50 µm). FIG. 8 is an enlarged schematic view of the propagation path and grating electrodes of Example 4. When a voltage of 5 V was applied to the electrodes for applying a direct-current electric field, which were formed at both ends of the semiconductor, to measure the amplification characteristics of the surface acoustic wave amplifier, the amplification gain at 1 GHz was found to be 33 dB.

Example 5

Figure 9:
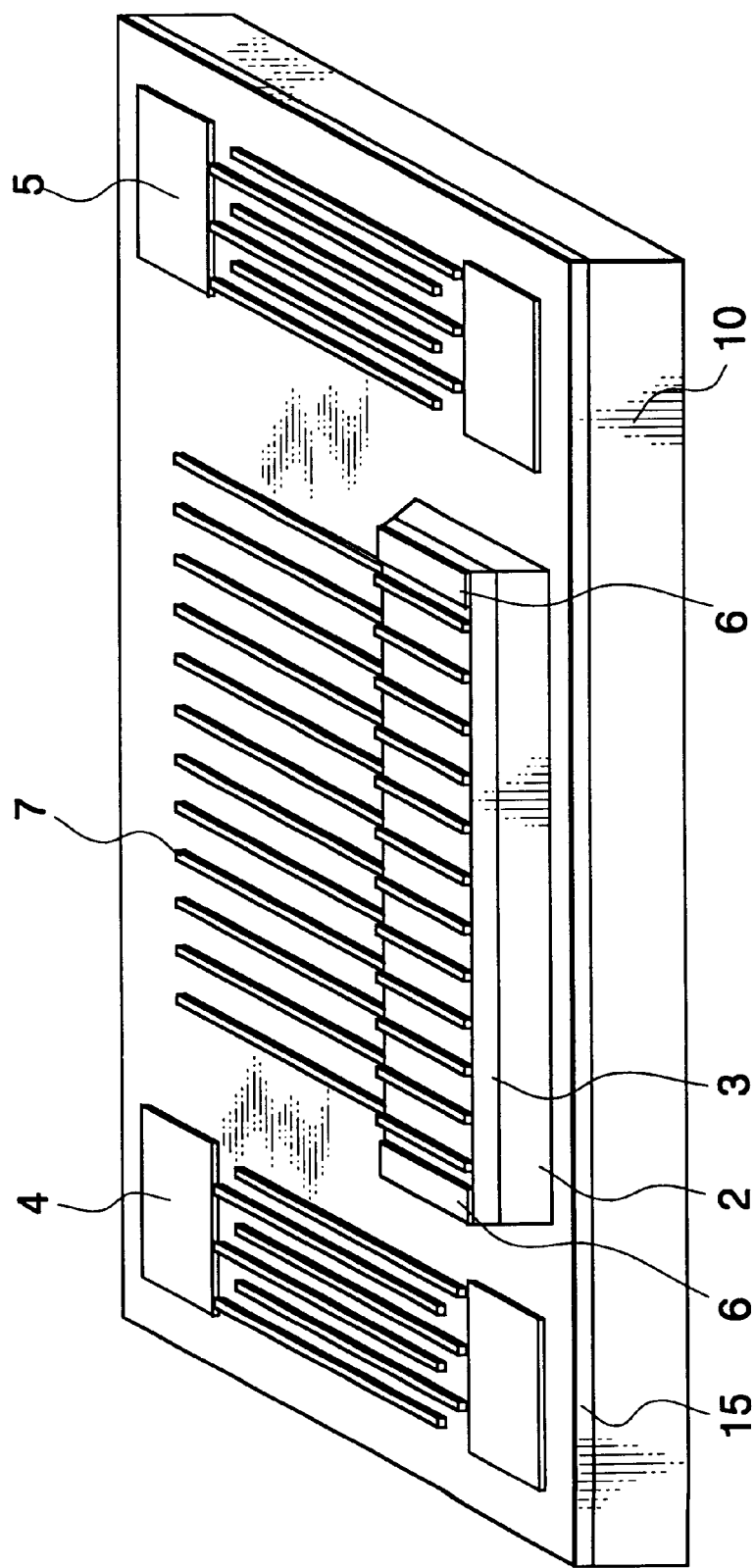
FIG. 9 is a schematic perspective view of a surface acoustic wave functional element using a piezoelectric film as the substrate, according to one embodiment of the present invention.

By the laser abrasion method, piezoelectric film 15 of $LiNbO_3$ was grown to a thickness of 200 nm on a sapphire R-surface substrate 10 of 3 inches in diameter to make a piezoelectric film substrate. Next, on this substrate, a buffer layer 2 of $Al_{0.5}Ga_{0.5}AsSb$ was grown to a thickness of 50 nm by the MBE method, and an active layer 3 of InSb was grown to a thickness of 500 nm. When electrical characteristics of the active layer were measured in the same way as in the case of Example 1, its carrier density and electron mobility were found to be $n_o=2.4\times10^{16}/cm^3$ and µ=25300 $cm^2$/Vs, respectively. Then through the same process as in the case of Example 1, a surface acoustic wave amplifier having the same structure as in FIG. 1 was made, with L, S, and W/a set to 0.8 µm, 0.8 µm, and 8, respectively (W=480 µm and a=60 µm). FIG. 9 is a schematic view of the amplifier. When a voltage of 5 V was applied to the electrodes for applying a direct-current electric field, which were formed at both ends of the semiconductor, to measure the amplification characteristics of the surface acoustic wave amplifier of Example 5, an amplification gain of 19 dB was provided at 1 GHz. The values of L and S were equal to λ/6.

Example 6

Figure 10:
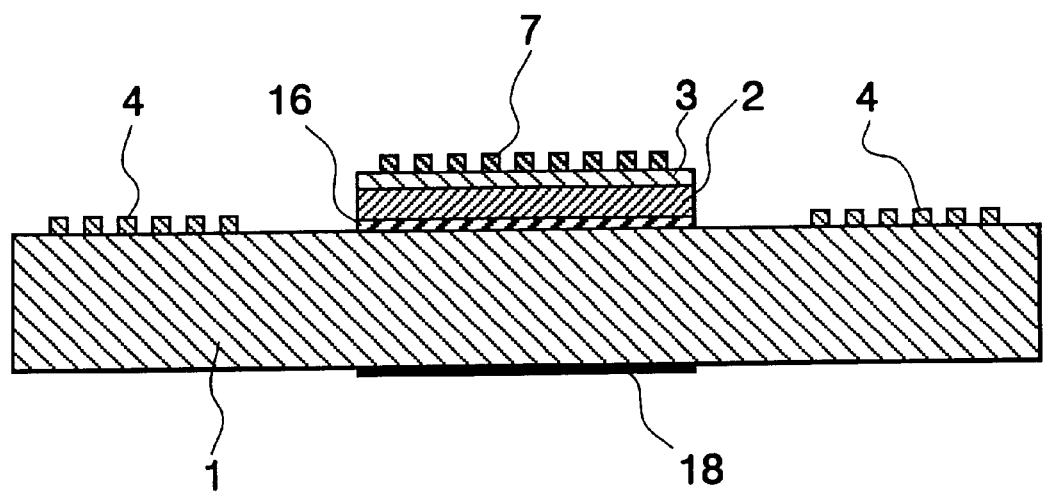
FIG. 10 is a sectional view of a surface acoustic wave functional element of a structure with a uniform output electrode below the buffer layer, according to one embodiment of the present invention.

On a piezoelectric substrate 1, as a 128° Y-cut $LiNbO_3$ substrate, a semiconductor lower part output electrode 16 of Al 400 nm thick was formed by vacuum deposition, and then a buffer layer 2 of $Al_{0.5}Ga_{0.5}AsSb$ was grown to a thickness of 50 nm over the substrate by the MBE method. Next, an active layer 3 of InSb was grown to a thickness of 500 nm. When electrical characteristics of the active layer were measured at room temperature in the same way as in the case of Example 1, its carrier density and electron mobility were found to be $n_o=2.6\times10^{16}/cm^3$ and µ=25400 $cm^2$/Vs, respectively. Then as shown in FIG. 1, the buffer layer 2 and active layer 3 were etched by photolithography to be strips so that the layers were only outside a propagation path for surface acoustic waves. After the output electrode of Al was removed by wet etching, two input electrodes (an input electrode and a reference signal input electrode) and grating electrodes 7, extending across the propagation path for surface acoustic waves and active layer, were formed by the lift-off method. The grating electrodes 7 were shaped so that L=S=λ/6=1.4 µm and that W/a=10 (W=400 µm and a=40 µm). Finally, a ground output electrode 18 was formed at the back of the piezoelectric substrate. FIG. 10 shows the cross-sectional structure of a surface acoustic wave convolver made through the above process. When the convolution characteristics of an output with a frequency of 1 GHz from the semiconductor lower part output electrode 16 were measured with an oscilloscope by applying an input signal (1 mW) through one of the input electrodes 4 and a reference signal (1 mW) through the other to the element of the example, the convolution output was found to be a good non-linear signal and its efficiency to correspond to −39.5 dBm.

Example 7

A semiconductor layer similar to that in Example 6 was grown on a piezoelectric substrate, and a surface acoustic wave convolver was made in the same way as in the case of Example 6. The grating electrodes 7 were shaped so that $L=S=\lambda/6=3.3$ μm and that $W/a=10$ ($W=400$ μm and $a=40$ μm). When the convolution characteristics of an output with a frequency of 400 MHz from the semiconductor lower part output electrode 16 were measured with an oscilloscope by applying an input signal (1 mW) through one of the input electrodes 4 and a reference signal (1 mW) through the other to the element of the example, the convolution output was found to be a good non-linear signal and its efficiency to be −39 dBm. A comparison with Example 6 shows that a good convolution output can be provided irrespective of frequency.

Comparative Example 4

On a 128° Y-cut LiNbO$_3$ substrate on which Al film was deposited, InSb film was grown to a thickness of 500 nm by the MBE method. When electrical characteristics of the InSb film were measured, it was found to have a low electron mobility of $\mu=6000$ cm$^2$/Vs. Evaluation of the convolution characteristics of a surface acoustic wave convolver, made in the same way as in the case of Example 6, showed that the efficiency of convolution output corresponded to only −51 dBm. This in turn means that if a semiconductor layer consisted of an InSb layer only, InSb crystalinity is so low that interaction between surface acoustic waves and electrons is inefficient.

Comparative Example 5

Figure 11:
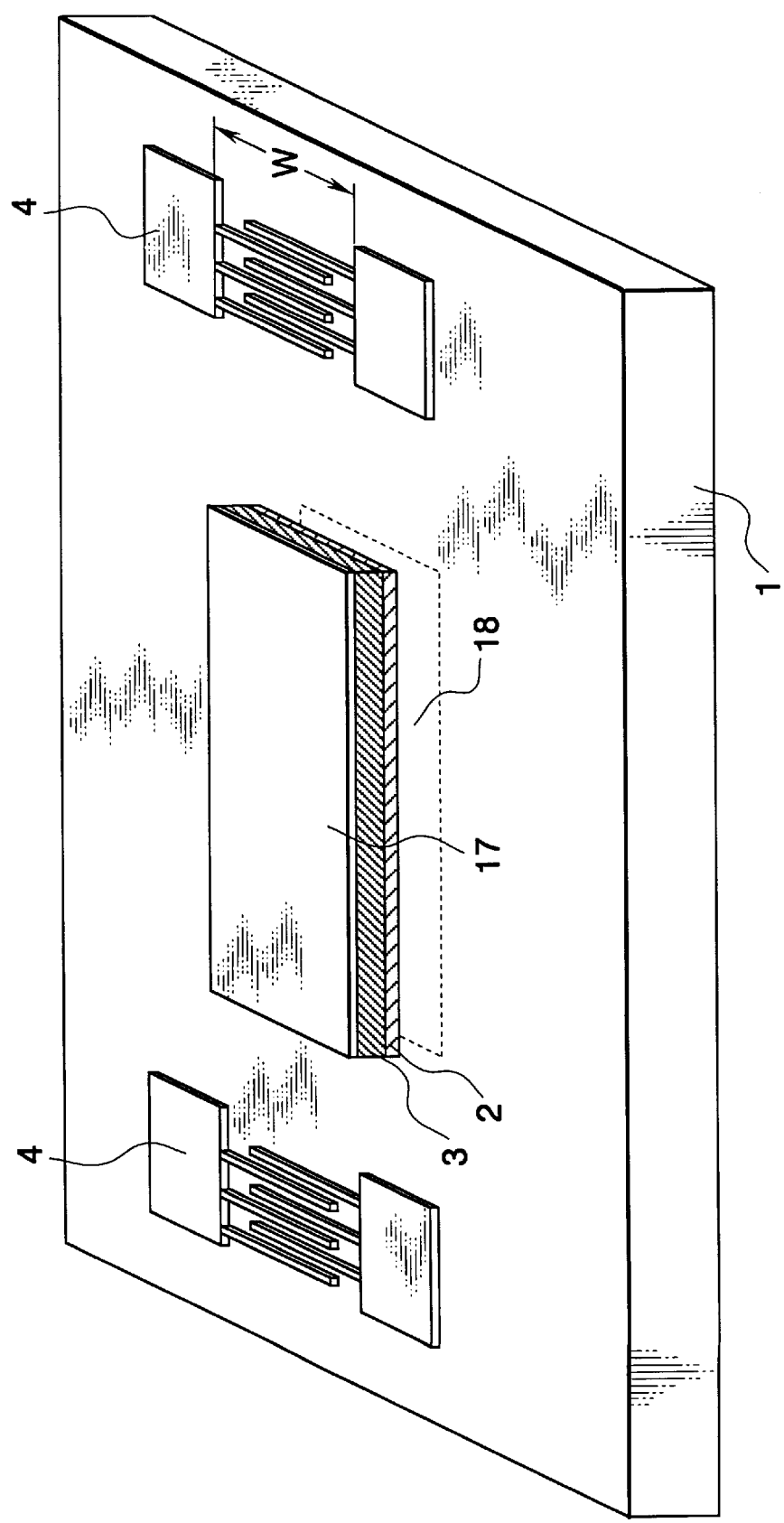
FIG. 11 is a schematic perspective view of a former surface acoustic wave convolver of a structure with a semiconductor layer provided above the propagation path.

On a 128° Y-cut LiNbO$_3$ substrate, Al film was deposited in the same way as in the case of Example 6. Next, a buffer layer 2 of Al$_{0.5}$Ga$_{0.5}$AsSb was grown to a thickness of 50 nm by the MBE method, and then an active layer 3 of InSb was grown to a thickness of 500 nm. The active layer was found to have the same electrical characteristics as in the case of Example 6. By photolithography, the semiconductor layer was etched to be positioned on a propagation path for surface acoustic waves. After exposed Al film was etched, an output electrode 17 was formed on two input electrodes and a semiconductor by the lift-off method. Finally, a ground output electrode 18 was formed at the back of the piezoelectric substrate 1. FIG. 11 is a schematic view of a surface acoustic wave convolver made according to the example. When convolution characteristics were measured in the same way as in the case of Example 6, the efficiency of convolution output was found to correspond to only −54 dBm. This means that if a semiconductor is on a propagation path, surface acoustic wave loss is so large that interaction between surface acoustic waves and electrons is inefficient.

Example 8

Figure 12:
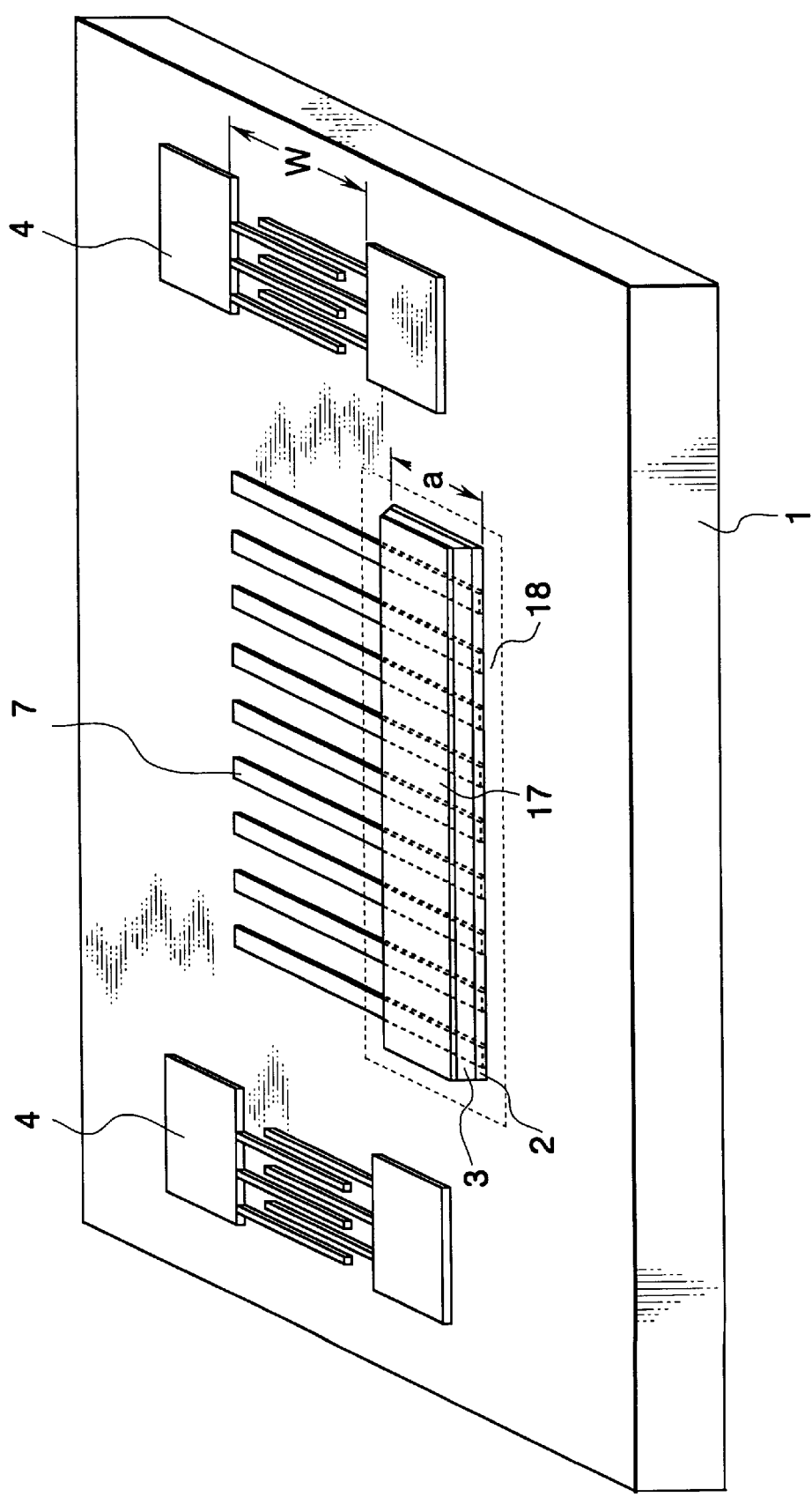
FIG. 12 is a schematic perspective view of a surface acoustic wave functional element of a structure with grating electrodes formed below the buffer layer, according to one embodiment of the present invention.
Figure 13:
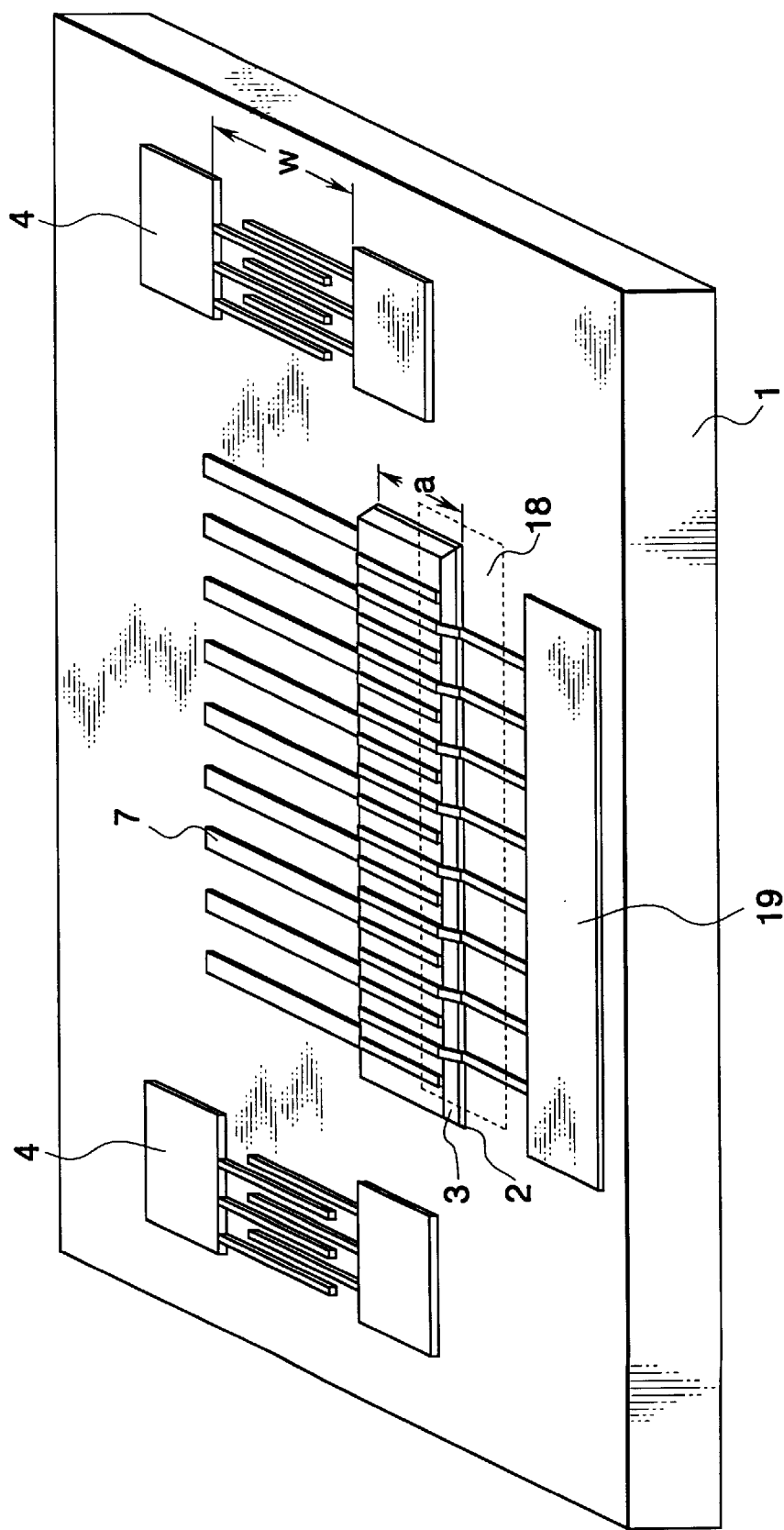
FIG. 13 is a schematic perspective view of a surface acoustic wave functional element of a structure with grating electrodes and output electrodes alternating each other on the active layer, according to one embodiment of the present invention.

On a piezoelectric substrate 1, as a 128° Y-cut LiNbO$_3$ single-crystal substrate, Al film was deposited to form grating electrodes 7 in place, and then a buffer layer 2 of Al$_{0.5}$Ga$_{0.5}$AsSb was grown to a thickness of 50 nm at a low temperature by the MBE method. Next, an active layer 3 of InSb was grown to a thickness of 500 nm. When electrical characteristics of the active layer were measured in the same way, its electron mobility was found to be $\mu=25600$ cm$^2$/Vs. By photolithography, the buffer layer 2 and active layer 3 were etched to be strips as shown in FIG. 12. Moreover, two input electrodes 4 and an output electrode 17 on a semiconductor layer were formed by the lift-off method. $L=S=\lambda/6=3.3$ μm and $W/a=10$ ($W=400$ μm and $a=40$ μm). Finally, a ground output electrode 18 was formed at the back of the piezoelectric substrate. When the convolution characteristics were measured for Example 8 in the same way as in the case of Example 7, the efficiency of convolution output was found to correspond to −40 dBm. The width of the grating electrodes used for the example and the spacing between them were $\lambda/6$.

Example 9

Using a piezoelectric substrate 1, as a 128° Y-cut LiNbO$_3$ single-crystal substrate three inches in diameter, a buffer layer 2 of Al$_{0.5}$Ga$_{0.5}$AsSb was grown to a thickness of 50 nm by the MBE method, and then an active layer 3 of InSb was grown to a thickness of 500 nm. The carrier density and electron mobility of the active layer were $n_o=1.8\times10^{16}$/cm$^3$ and $\mu=33000$ cm$^2$/Vs, respectively. Then as shown in FIG. 1, the buffer layer 2 and active layer 3 were etched by lithography to be strips, and grating electrodes 7, an output electrode 19 intersecting the grating electrodes 7 on a semiconductor layer, and two input electrodes 4 were formed by the liftoff method. Finally, a ground output electrode 18 was formed at the back of piezoelectric substrate. The width of the grating electrodes 7, L, and the spacing between them, S, were $\lambda/6=4.0$ μm. At the intersection on the semiconductor, however, $L=S=\lambda/12=2.0$ μm and $W/a=10$ ($W=400$ μm and $a=40$ μm). When the convolution characteristics were measured for Example 9 in the same way as in the case of Example 7, a good convolution output with a frequency of 333 MHz was obtained from between the output electrode 19 and the ground output electrode 18 at the back of the piezoelectric substrate, and the efficiency of the output was found to correspond to −35 dBm. That is, forming the output electrode strengthened interaction on the semiconductor layer, so that higher efficiency was provided, compared with the output electrode in Example 7. In Example 9, the grating electrodes and output electrode intersecting them may be formed under the semiconductor layer. In addition, the ground output electrode may also be formed under the semiconductor layer.

Example 10

Figure 14:
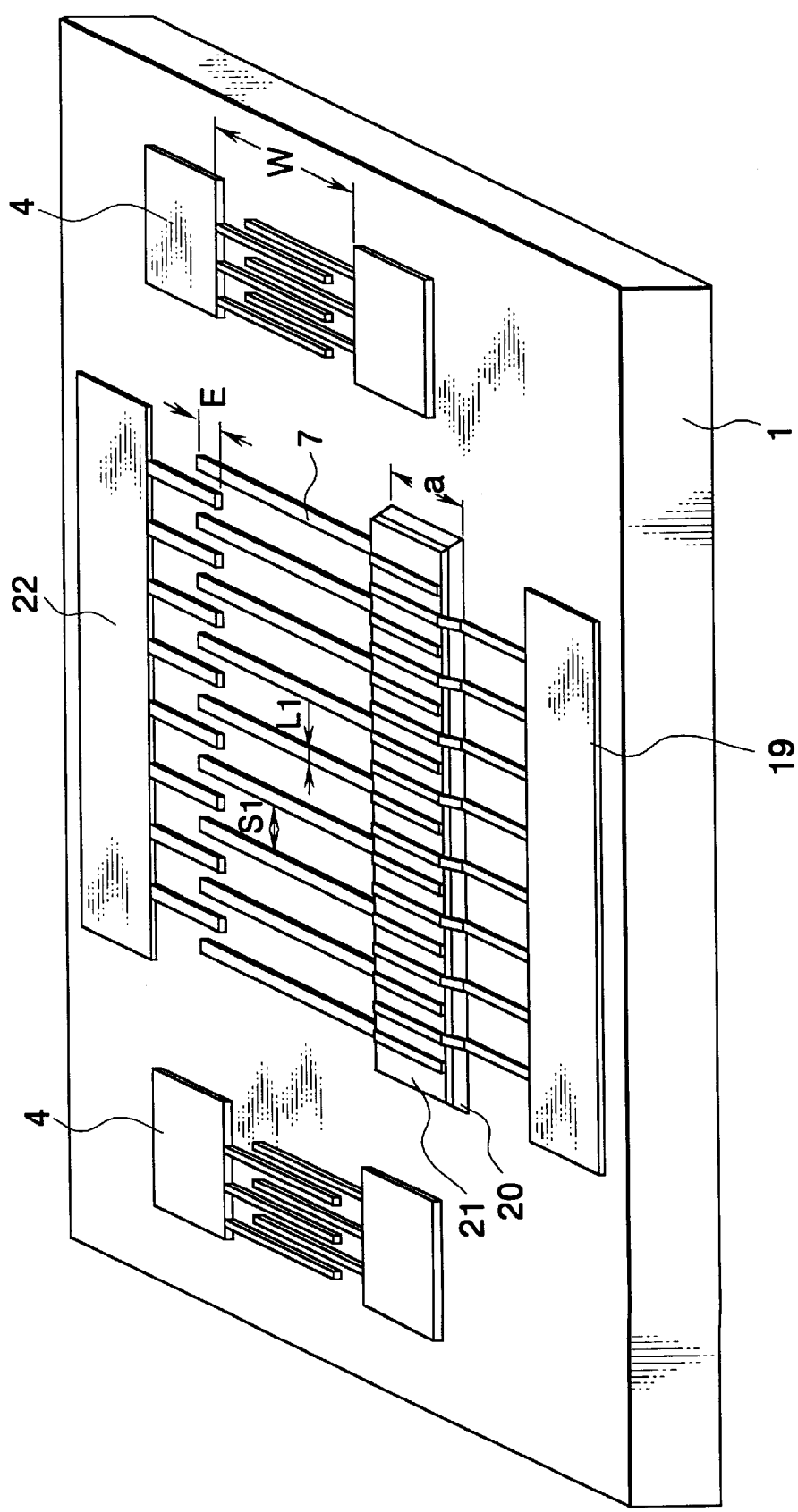
FIG. 14 is a schematic perspective view of a surface acoustic wave functional element with a semiconductor layer, grating electrodes, an output electrode alternating the grating electrodes and a ground output electrode formed, according to one embodiment of the present invention.

On a piezoelectric substrate 1, or a 128° Y-cut LiNbO$_3$ substrate, a semiconductor layer 20 consisting of a buffer layer 2 and an active layer 3 was formed outside a propagation path in the same way as in the case of Example 9. The active layer had the same film characteristics as that of Example 9. In addition, SiO$_2$ film 21 300 nm thick was formed on the semiconductor layer. Then by the lift-off method, grating electrodes 7 and an output electrode 19 were formed on the semiconductor layer, and then a ground output electrode 22, which was narrower than the propagation path, was formed so that the electrode intersected those parts of the grating electrode which were opposite to the semiconductor layer. FIG. 14 is a schematic view of a surface acoustic wave functional element according to Example 10. When the convolution characteristics were measured for Example 10 in the same way as in the case of Example 7, an excellent convolution output was obtained from the output electrode, and the efficiency corresponding to −32 dBm was attained. In Example 10, the width of the grating electrodes, L1, and spacing between them, S1, on the propagation path, satisfied the equation $2L1=S1=\lambda/4=5$ μm. Example 10 was arranged so that the width of the grating electrodes, that of the output electrode, and the distance between the grating electrodes and the output electrode was $\lambda/8$ at the intersection.

Although a ground output electrode can be formed to be wider than a propagation path, the output electrode is more preferably arranged to be narrower than the propagation path and intersect grating electrodes outside the path.

In Example 10, a dielectric layer 21 was inserted between the semiconductor layer and the grating electrodes. The dielectric layer 21 is for making schottky contacts between the semiconductor layer and grating electrodes. However, the dielectric layer 21 is unnecessary if schottky contacts can easily be formed by grating electrode deposition.

Example 11

Figure 15:
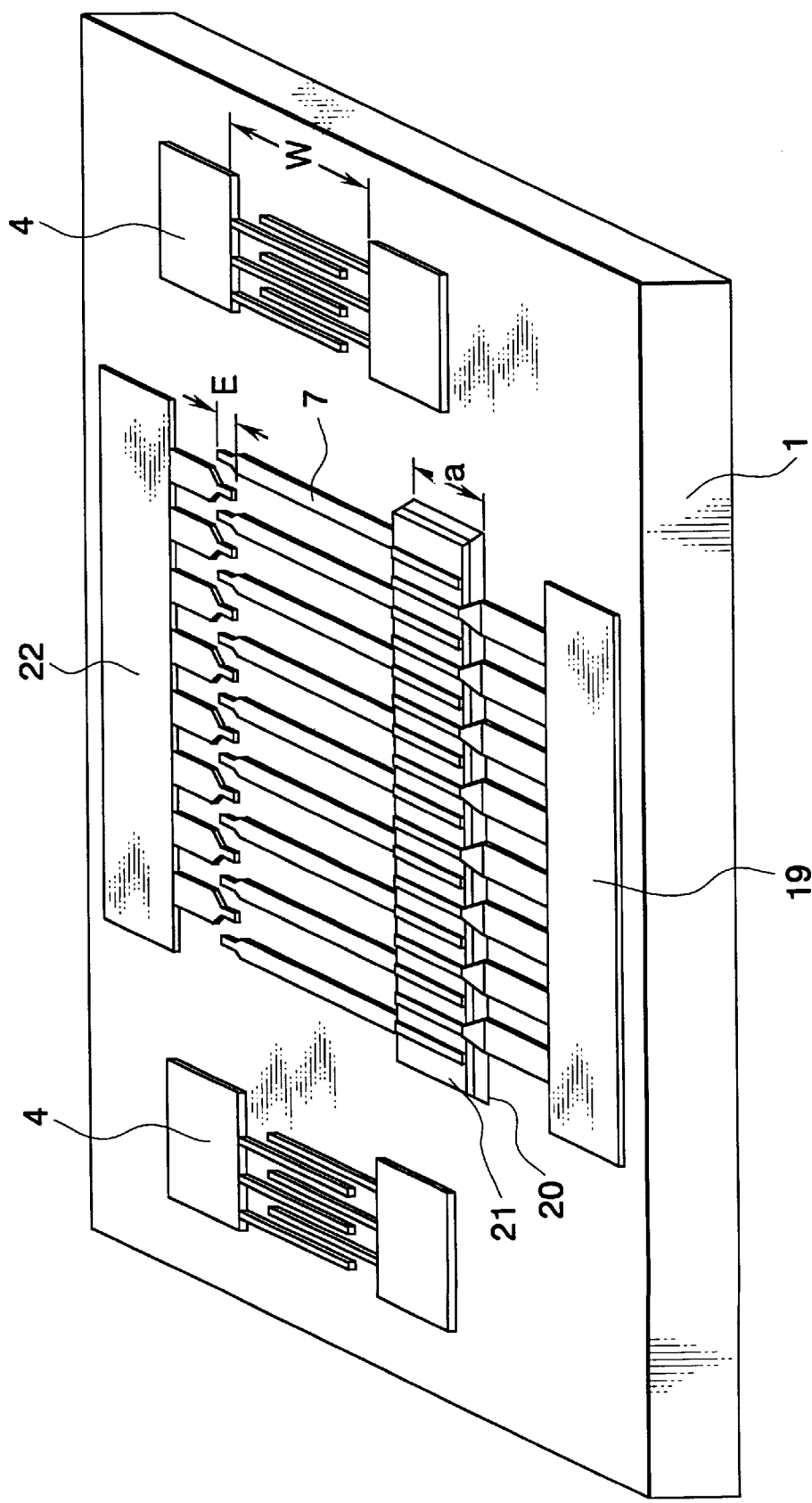
FIG. 15 is a schematic perspective view of a surface acoustic wave functional element with a semiconductor layer, grating electrodes, an output electrode alternating the grating electrodes and a ground output electrode formed so that the period of the alternating portion differs from that above the propagation path, according to one embodiment of the present invention.
Figure 16:
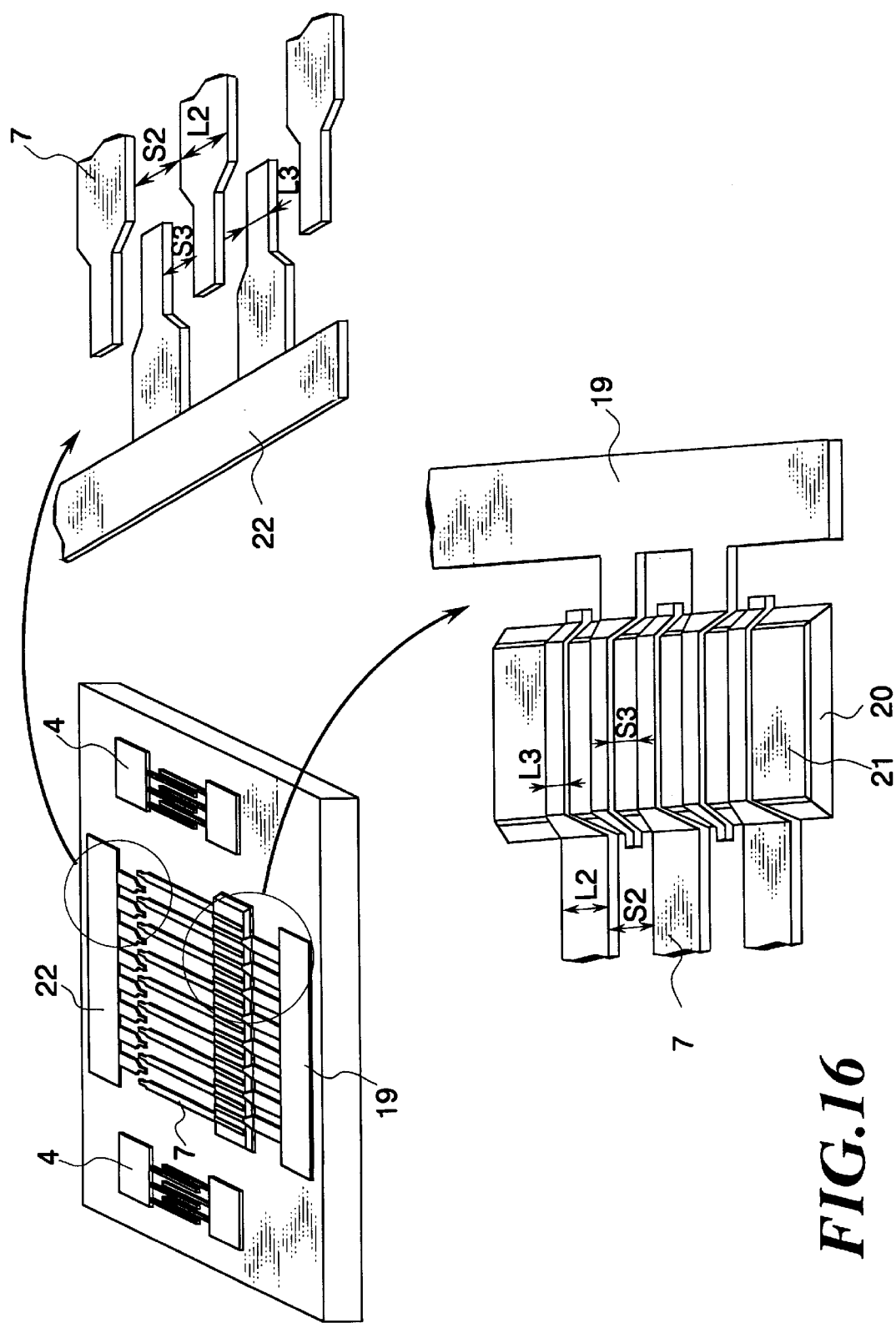
FIG. 16 is an enlarged illustration of the alternating portion of grating electrodes and an output electrode and that of grating electrodes and a ground output electrode in a surface acoustic wave functional element according to one embodiment of the present invention.
Figure 17:
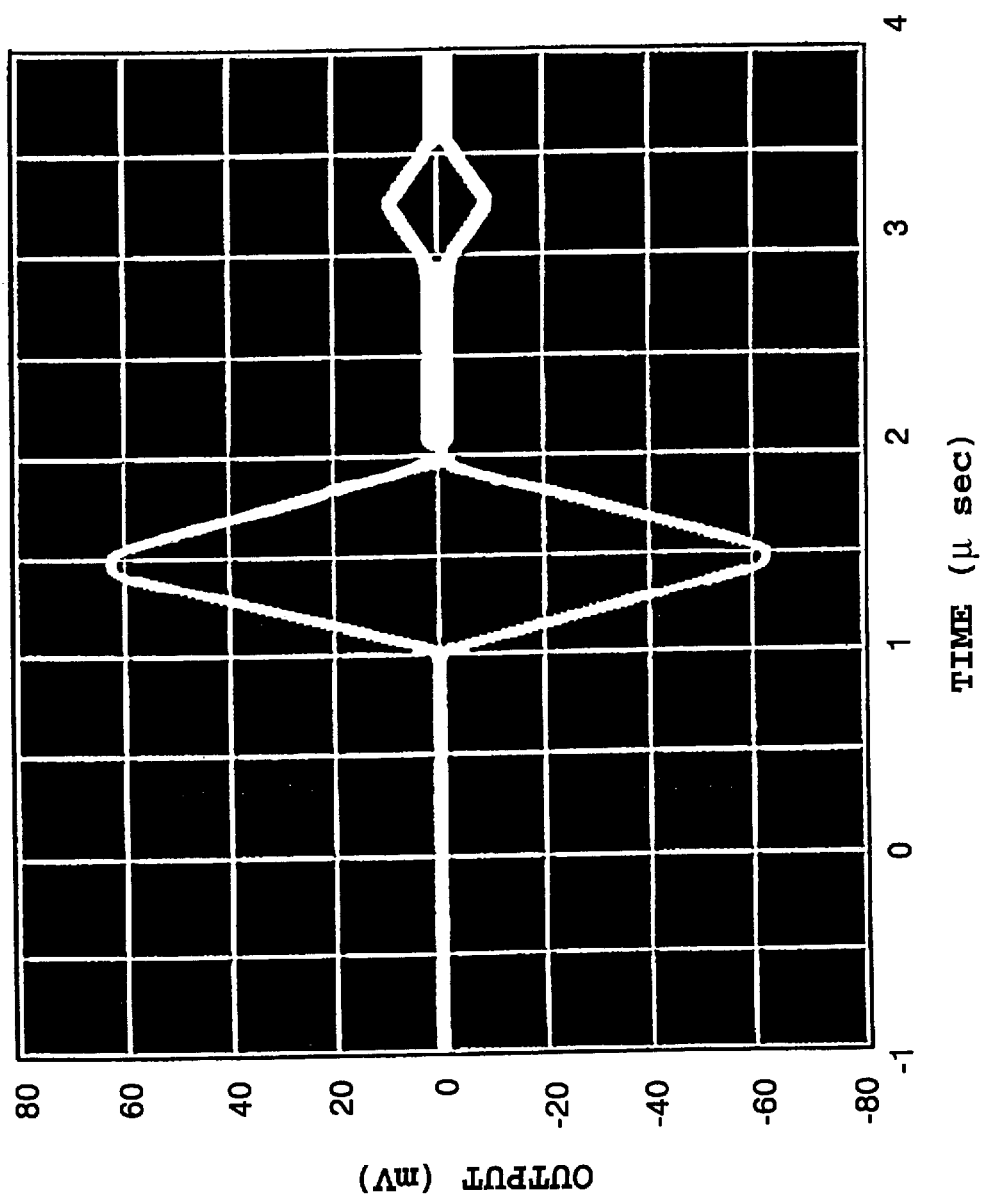
FIG. 17 is a waveform diagram showing the convolver output waveform obtained actually from a surface acoustic wave functional element according to one embodiment of the present invention.

A surface acoustic wave functional element was formed in the same way as in the case of Example 10 so that the width of grating electrodes 7 on a propagation path, L2, and the spacing between them, S2, satisfied the equation L2=S2=λ/8 and that the width of grating electrodes on the semiconductor layer and at the intersections between grating electrodes opposite to the semiconductor layer, output electrode 19, and ground output electrode 22, L3, and the spacing between the electrodes, S3, satisfied the equation L3=S3=λ/16. For Example 11, the value of λ was 40 μm. FIG. 15 is a general schematic view of the surface acoustic wave functional element, and FIG. 16 is an enlarged view of an intersection. The intersections between the grating electrodes 7 and the ground output electrode 24 were formed outside the propagation path so that the width of the intersections, E, was smaller than that of the propagation path, W, and equal to 3λ. When the convolution characteristics were measured for Example 11 in the same way as in the case of Example 7, a good convolution output with a frequency of 200 MHz was obtained from the output electrode, and its efficiency was markedly high, at −30 dBm. FIG. 17 shows a convolution output waveform observed.

Example 12

Figure 18:
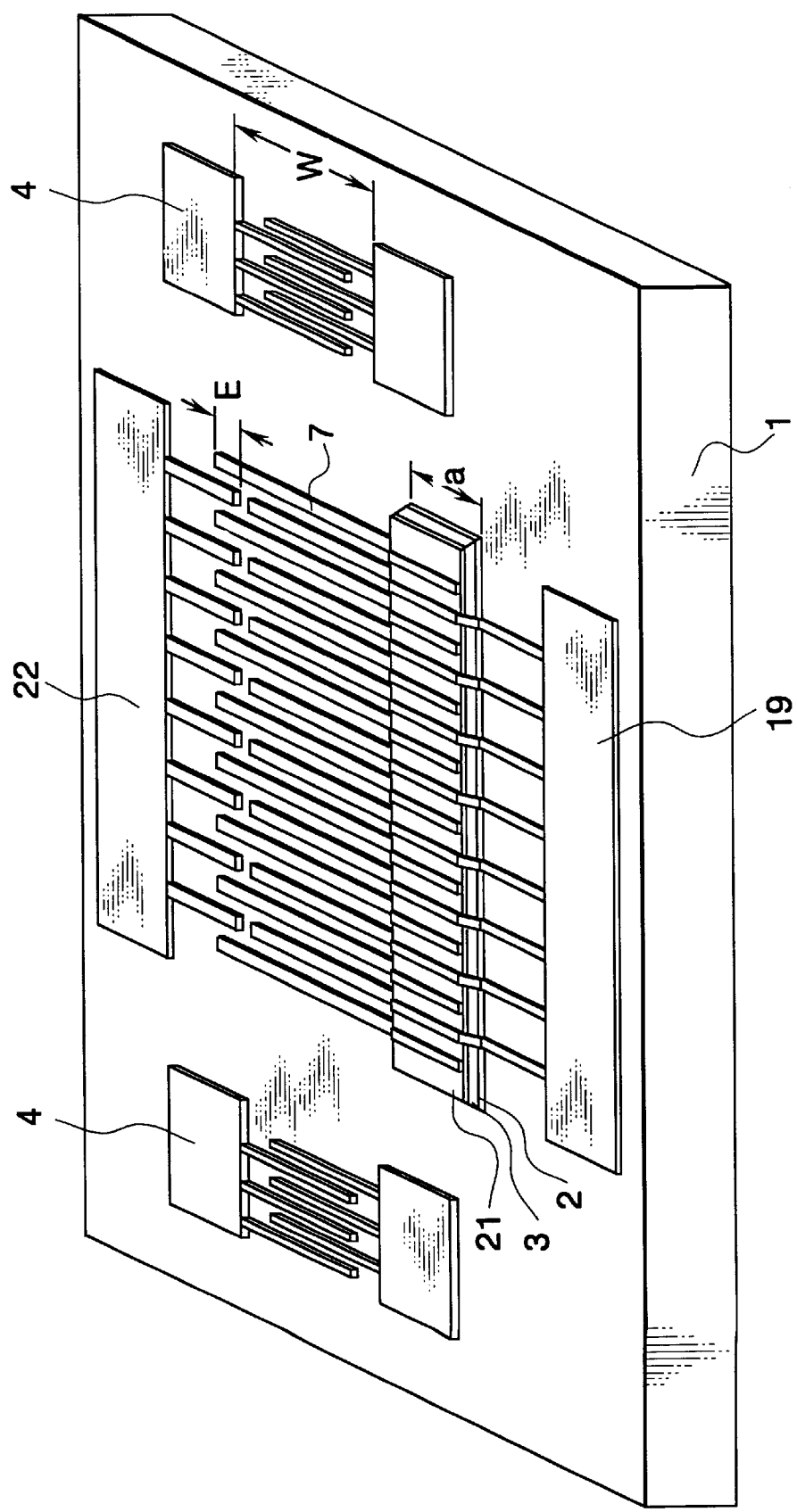
FIG. 18 is a schematic perspective view of a surface acoustic wave functional element with the alternating portion of grating electrodes and an output electrode formed over the active layer to the propagation path, according to one embodiment of the present invention.

A surface acoustic wave functional element was made in the same way as in the case of Example 10. Connections between the grating electrodes 7 and output electrode 19 were formed over the semiconductor and propagation path as shown especially in FIG. 18. Example 12 was arranged so that the width of the grating and output electrodes and the spacing between them were λ/8. When the convolution characteristics of a surface acoustic wave functional element were measured for Example 12 in the same way as in the case of Example 7, a good convolution output was obtained from the output electrode, and its efficiency corresponded to −36 dBm.

Example 13

Figure 19:
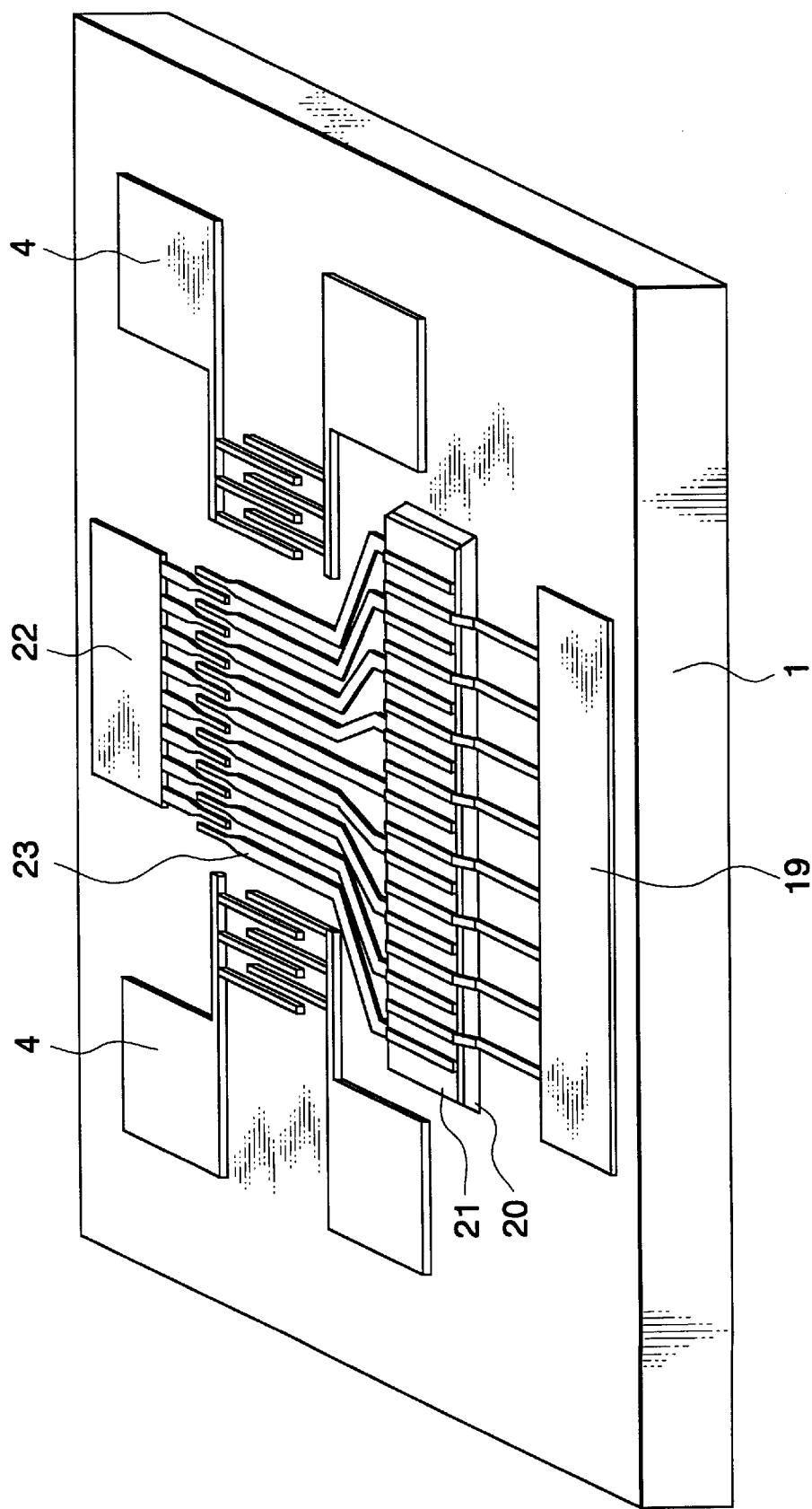
FIG. 19 is a schematic perspective view of a surface acoustic wave functional element with deformed grating electrodes formed on the active layer and an output electrode and the ground output electrode alternating the grating electrodes formed, according to one embodiment of the present invention.

A surface acoustic wave functional element was made in the same way as in the case of Example 10. As shown especially in FIG. 19, the length of the semiconductor was doubled, and deformed grating electrodes 23, an output electrode 19, and a ground output electrode 22 were formed to prevent the pitch between the grating and output electrodes from changing. Example 13 was arranged so that the width of the grating electrodes, L; the spacing between them; the width of the output electrode; and the distance between the grating electrodes and output electrode were all λ/8. When the convolution characteristics of a surface acoustic wave functional element were measured for Example 13 in the same way as in the case of Example 7, a good convolution output was obtained from the output electrode, and its efficiency corresponded to −36 dBm. The electrode structure according to Example 13 makes it easier to finely work the intersections between the grating and output electrodes.

Example 14

Figure 20:
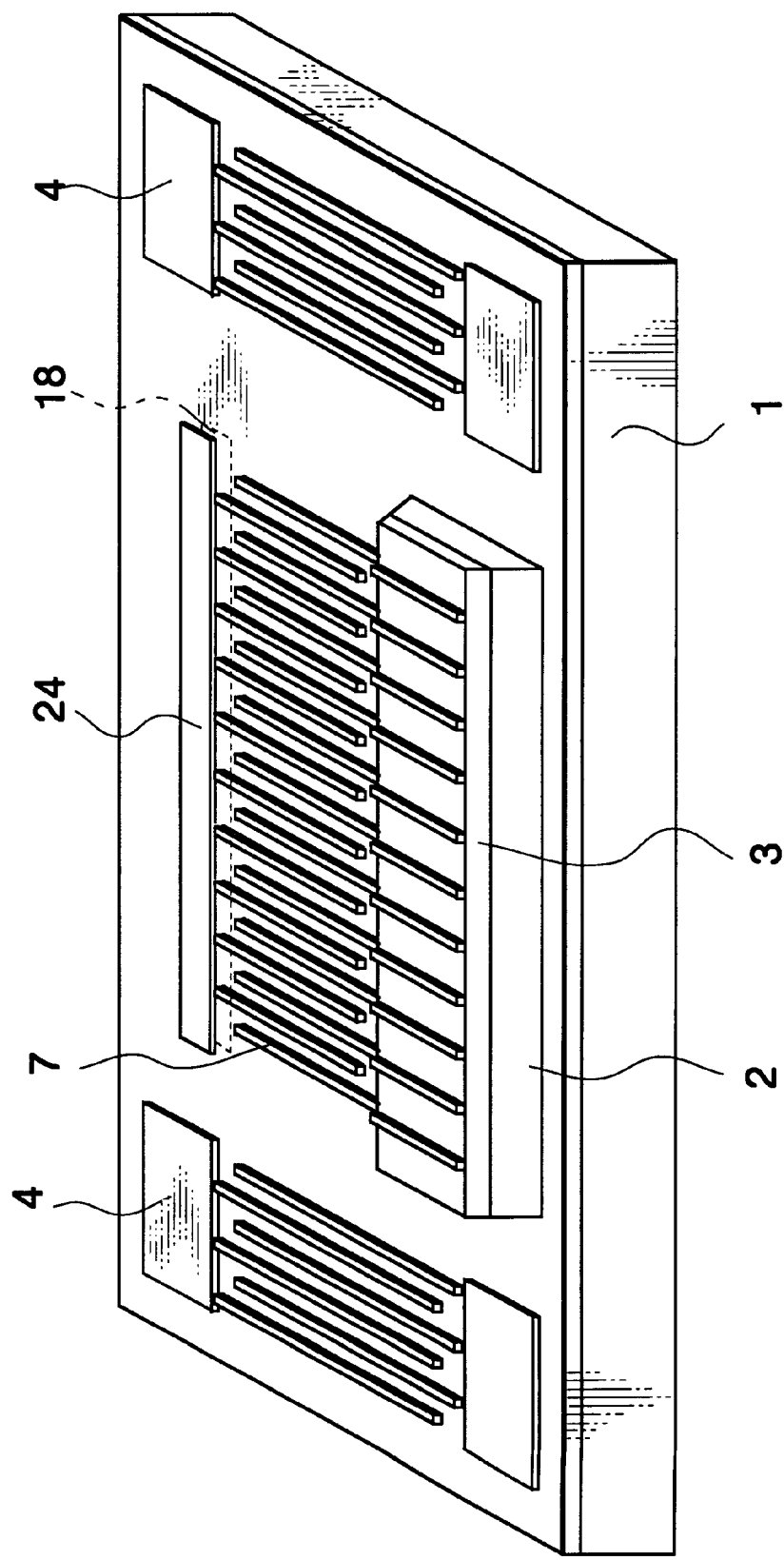
FIG. 20 is a schematic perspective view of a surface acoustic wave functional element comprising grating electrodes formed on the active layer and comprising an output electrode formed so as to cross the grating electrodes above the propagation path, according to one embodiment of the present invention.

As in the case of Example 10, on a 128° Y-cut LiNbO$_3$ single-crystal substrate 1, a buffer layer 2 of Al$_{0.5}$Ga$_{0.5}$AsSb was grown to a thickness of 50 nm by the MBE method, and then an active layer 3 of InSb was grown to a thickness of 500 nm on the buffer layer. The InSb film had the same characteristics as that of Example 9. In Example 14, etching was done, leaving parts of the semiconductor layer in place intact as shown in FIG. 20. Then the lift-off method was used to form two input electrodes 4, grating electrodes 7 on the semiconductor layer, and an output electrode 24, which extended over a propagation path while intersecting the grating electrodes 7. Finally, a ground output electrode 18 was formed at the back of the piezoelectric substrate. When the convolution characteristics of a surface acoustic wave functional element according to Example 14 were measured similarly, a good convolution output was obtained, and its efficiency corresponded to −40 dBm.

Example 15

Figures 21A, 21B:
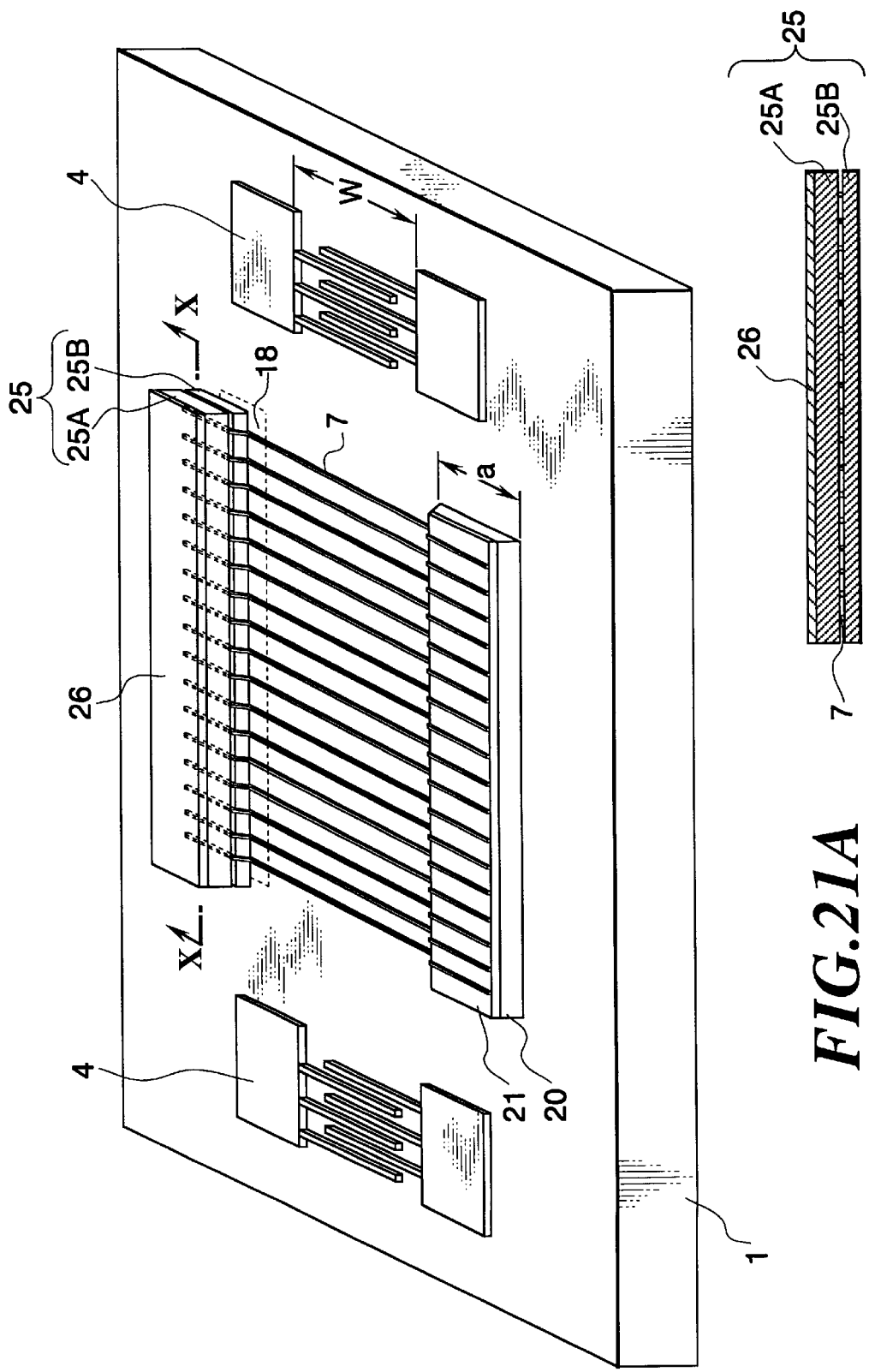
FIG. 21A is a schematic perspective view of a surface acoustic wave functional element of a structure with grating electrodes formed on the active layer and a strip dielectric film formed at the grating electrode sections opposed to the semiconductor layer, according to one embodiment of the present invention.
FIG. 21B is a sectional view taken along the line X-X' of FIG. 21A.

On a piezoelectric substrate 1, as a 128° Y-cut LiNbO$_3$ substrate, a semiconductor layer 20 of InSb was grown to a thickness of 500 nm by the MBE method. When the electrical characteristics of the semiconductor layer were measured, its electron mobility was found to be μ=6500 cm$^2$/Vs. A dielectric layer 21, including SiO$_2$ film, and strip dielectric film 25B which were 30 nm thick were formed on the semiconductor layer. By photolithography, the InSb layer was etched so that it was only outside a propagation path. Moreover, by the lift-off method, grating electrodes 7 and output electrodes 4 were formed as shown in FIG. 21A. Then strip dielectric film 25A was formed on those parts of the grating electrodes which were opposite to the semiconductor layer, and an output electrode 26 was formed on the strip dielectric film 25A. Finally, at the back of the piezoelectric substrate, a ground output electrode 18 was formed in the position corresponding to the strip dielectric film. The width of the grating electrodes in Example 15, L, and the spacing between them, S, were L=S=λ/6=3.33 μm, and the width of the propagation path, W, and that of the semiconductor, a, were W=400 μm and a=40 μm, respectively. When the convolution characteristics were measured for Example 15 in the same way as in the case of Example 7, a good convolution output was obtained from the output electrode on the strip dielectric film, and its efficiency corresponded to −39 dBm. That is, it was confirmed that a convolution output signal due to interaction on a semiconductor layer between surface acoustic waves traveling through grating electrodes can be extracted efficiently through dielectric film.

The strip dielectric film 25 of the example does not always need to have a sandwich structure but may be formed only on top of the grating electrodes. The ground output electrode may also be formed under dielectric film provided at the bottom of the grating electrodes. It is also possible to form the grating electrodes under the semiconductor layer. Besides the output electrode on the dielectric film, an output electrode can be provided on top of, or at the bottom of, the semiconductor layer to attain high efficiency by adding outputs together.

Example 16

Figure 22:
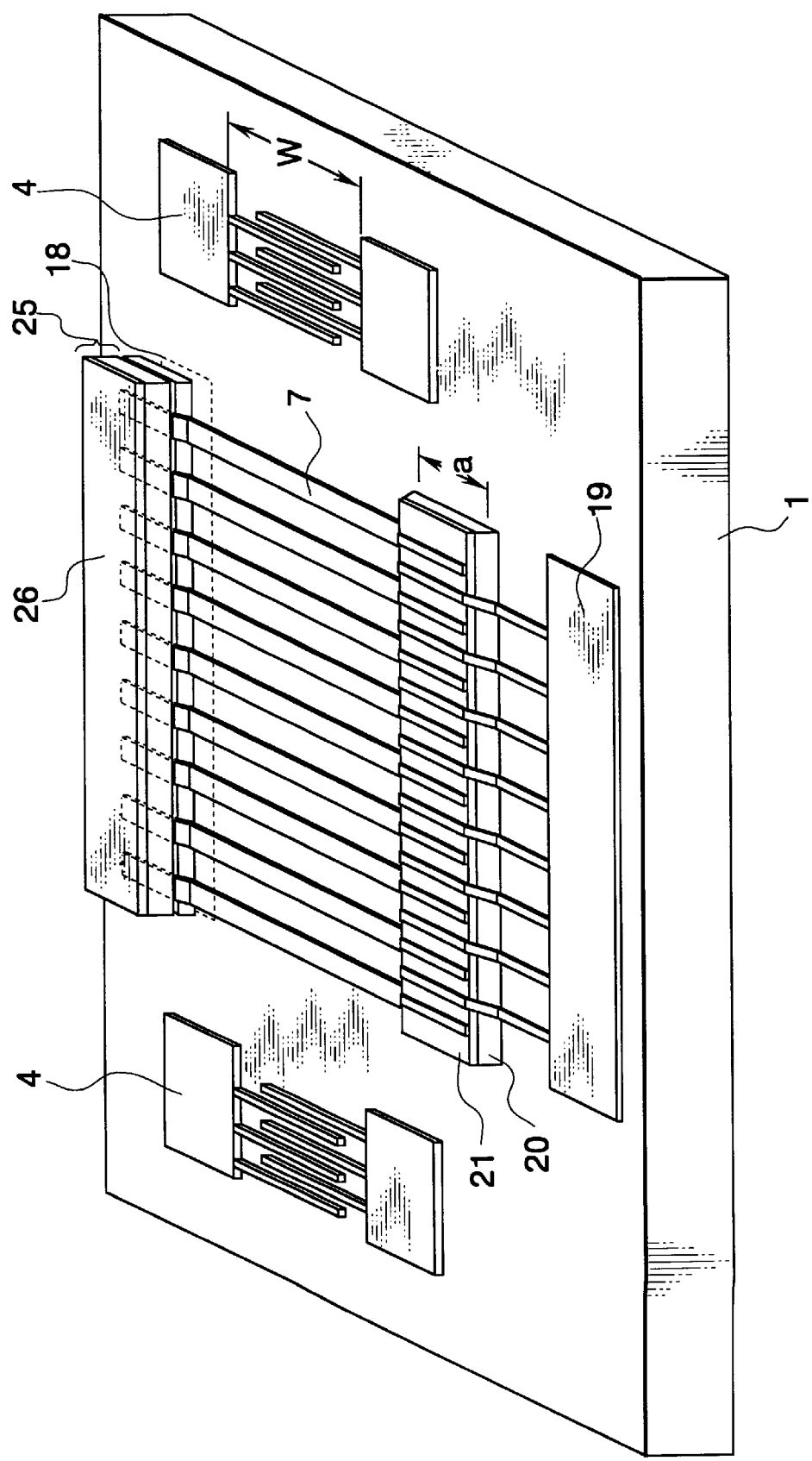
FIG. 22 is a schematic perspective view of a surface acoustic wave functional element of a structure with grating electrodes and an output electrode alternating them formed above the semiconductor layer and a strip dielectric film formed at the grating electrode sections opposed to the semiconductor layer, according to one embodiment of the present invention.
Figure 23:
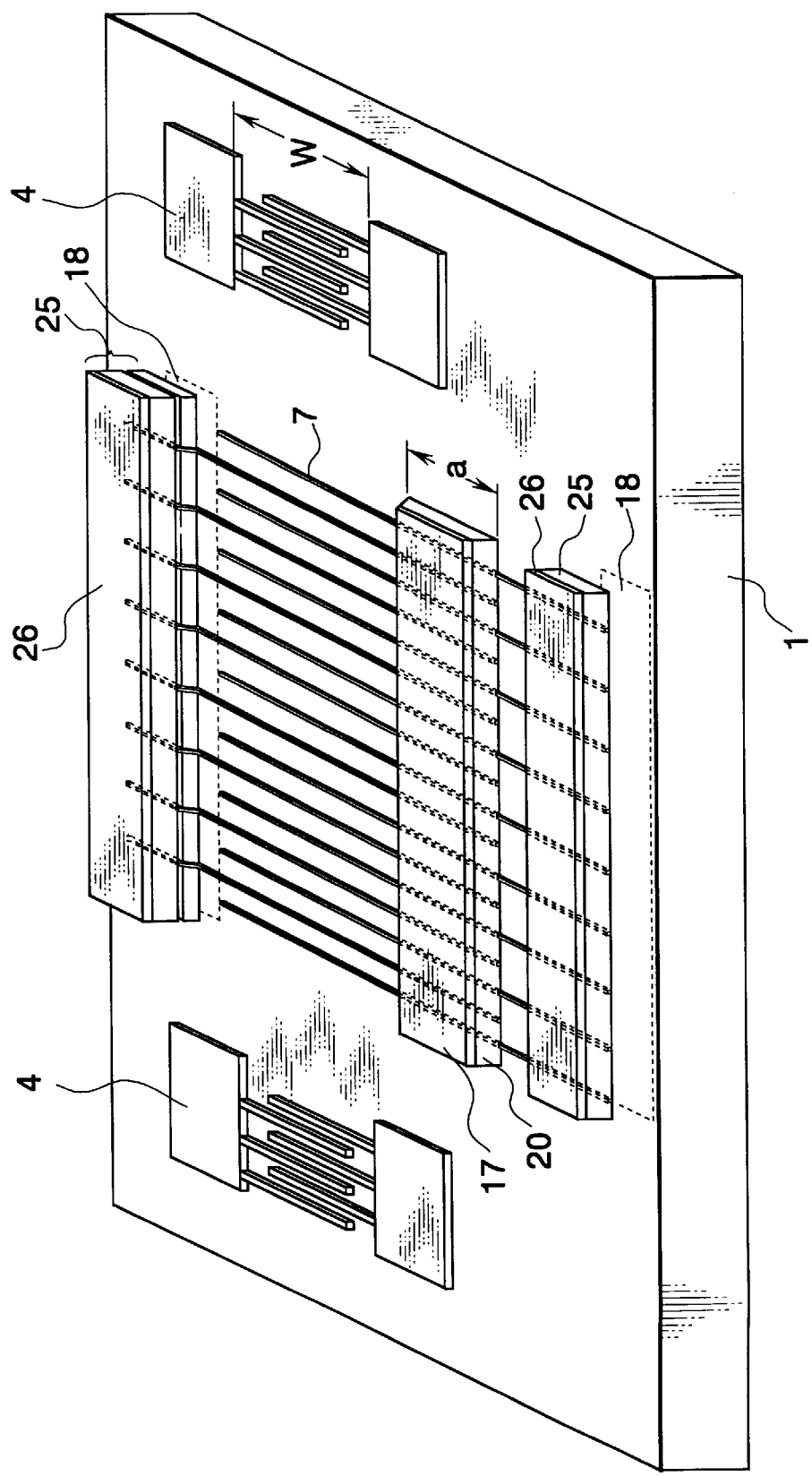
FIG. 23 is a schematic perspective view of a surface acoustic wave functional element of a structure with grating electrodes of alternately varied lengths in an appropriate combination formed below the semiconductor layer and a strip dielectric film formed at the respective one ends of alternate grating electrodes, according to one embodiment of the resent invention.

A film structure was built in the same way as in the case of Example 15. Etching was done so that an InSb layer 20, that is., a semiconductor layer was only outside a propagation path. Then the lift-off method was used as shown in FIG. 22 to form two input electrodes 4, grating electrodes 7, and an output electrode 19 which was disposed so that the electrode intersect the grating electrodes 7 on the semiconductor layer. In addition, strip dielectric film 25 was formed in those parts of the grating electrodes which were opposite to the semiconductor layer 20, and an output electrode 26 was formed on the film. Finally, at the back of the piezoelectric substrate, a ground output electrode 18 was provided in the position corresponding to the strip dielectric film 25. The width of the grating electrodes in Example 16, L, and the spacing between them, S, were L=S=λ/6 =3.33 μm, and the width of the propagation path, W, and that of the semiconductor, a, were W=400 μm and a=40 μm, respectively. When the convolution characteristics were measured for Example 16 in the same way as in the case of Example 7, a good convolution output was obtained from the output electrode 26 on the strip dielectric film and from the output electrode 19, and its efficiency corresponded to −37 dBm. The grating and output electrodes may be formed under the semiconductor layer. The grating electrodes may also be sandwiched between strip dielectric layers.

Example 17

Figure 2:
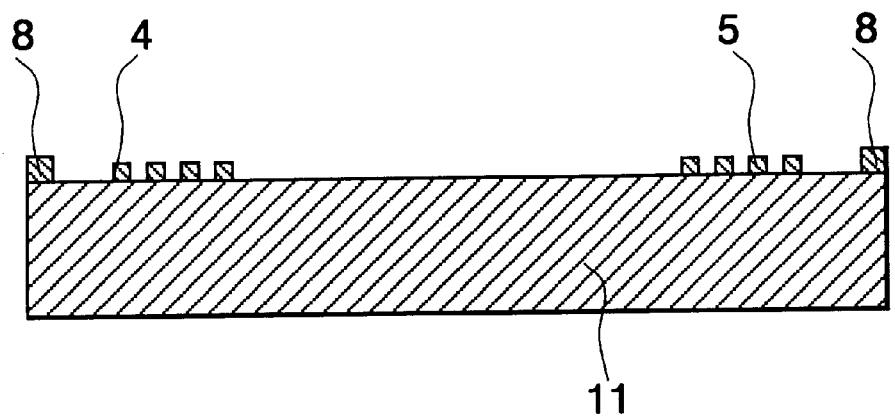
FIG. 2 is a schematic sectional view of a former direct type amplifier.
Figure 3:
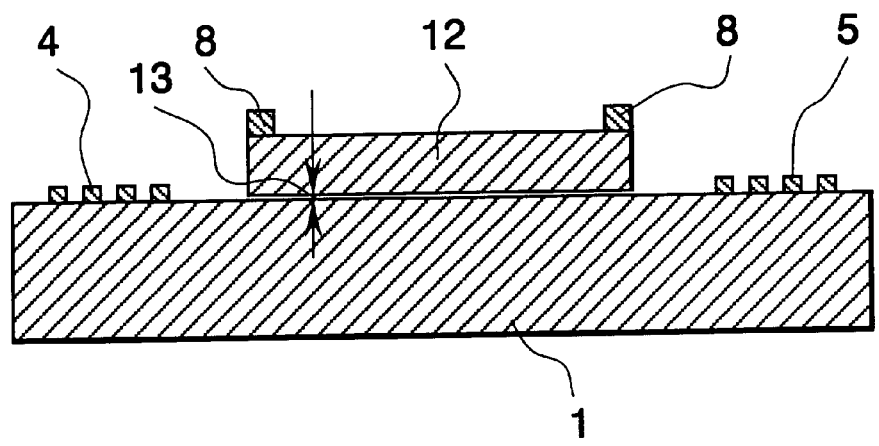
FIG. 3 is a schematic sectional view of a former separate type amplifier.
Figure 4:
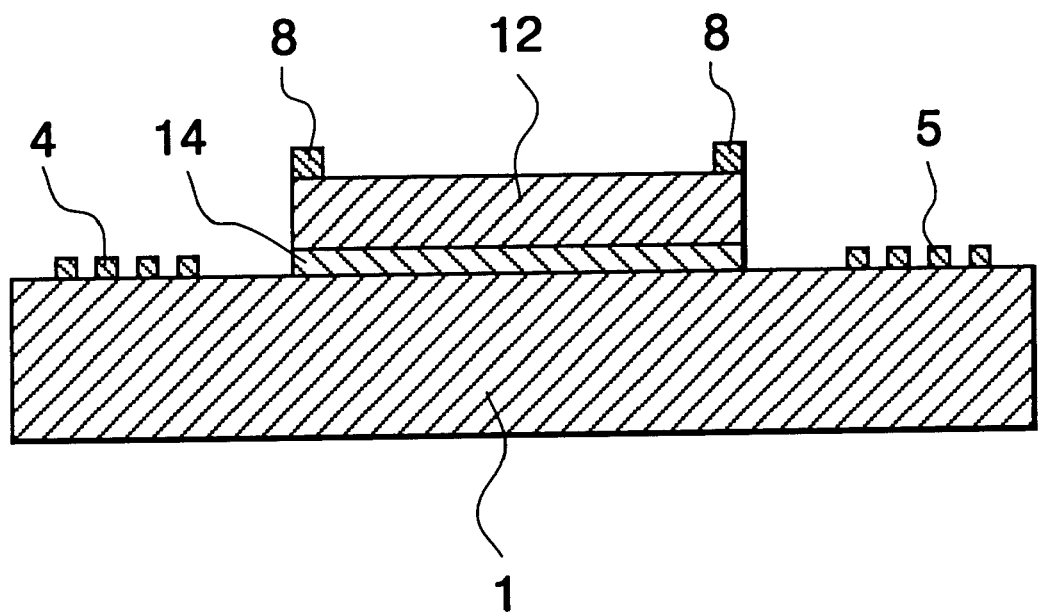
FIG. 4 is a schematic sectional view of a former monolithic type amplifier.

On a piezoelectric substrate 1, as a 128° Y-cut LiNbO$_3$ single-crystal substrate, alternate grating electrodes 7 were formed by varying alternately lengths in width of the grating electrodes in an appropriate combination as shown in FIGS. 2 and 3. Then an InSb layer 20 was grown to a thickness of 500 nm by the MBE method. The electron mobility of the layer was found to be μ=6000 cm$^2$/Vs. Unnecessary parts of the InSb layer were etched by photolithography to remove them, and strip dielectric film 25 was formed at one end of each of the grating electrodes as in Example 15. The lift-off method was used to form two input electrodes 4, an output electrode 17 on the semiconductor layer, and an output electrode 26 on the strip dielectric film. Finally, at the back of the piezoelectric substrate, a ground output electrode 18 was provided in the position corresponding to the strip dielectric film. When the convolution characteristics were measured for Example 17 in the same way as in the case of Example 7, a good convolution output was obtained from the two output electrodes on the strip dielectric film and the semiconductor layer, and its efficiency corresponded to −38 dBm. The width of the grating electrodes in Example 17, L, and the spacing between them, S, were L=S=λ/6=3.33 μm.

Example 18

Figure 24:
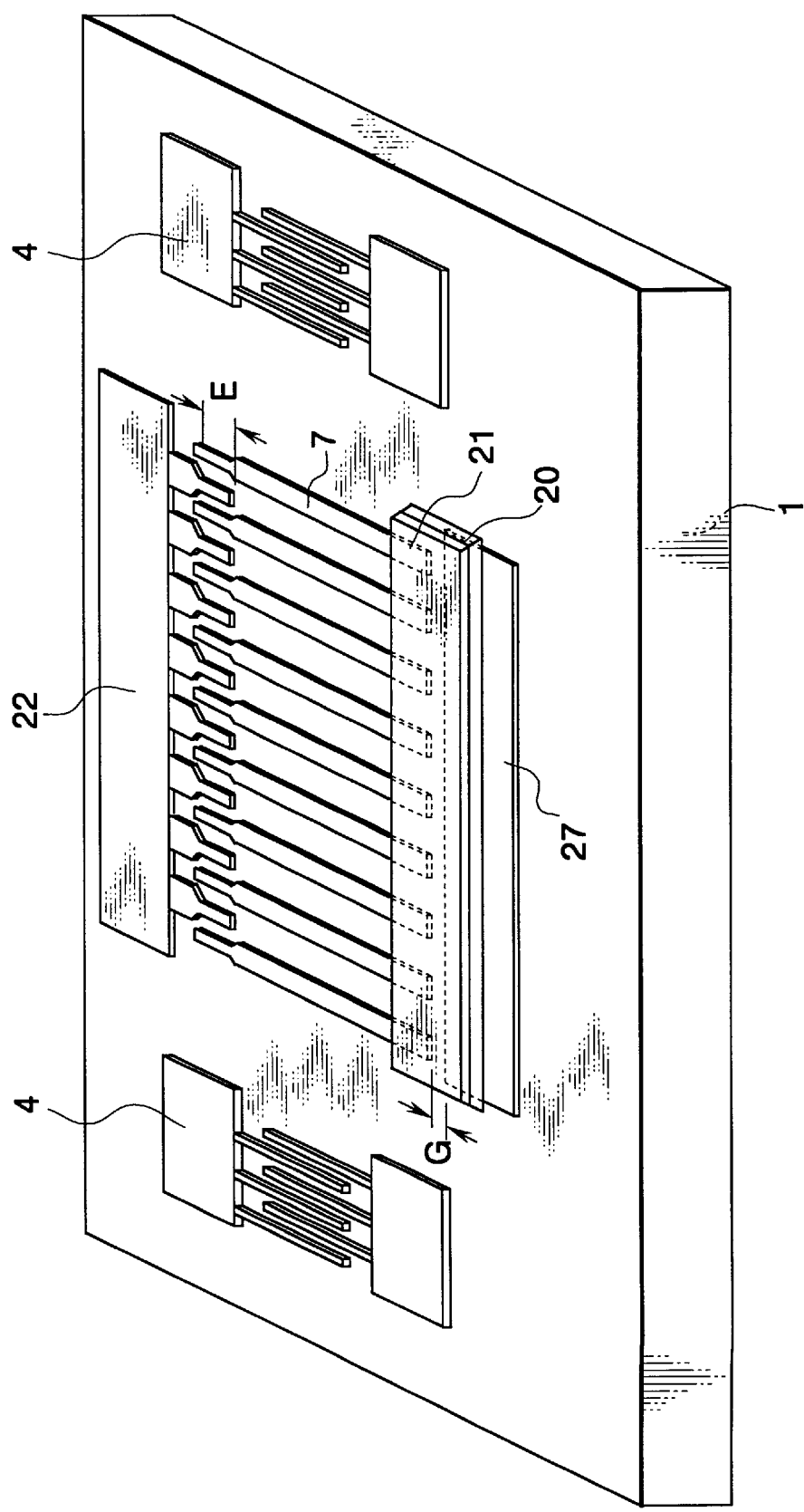
FIG. 24 is a schematic perspective view of a surface acoustic wave functional element of a structure with a uniform output electrode formed at the bottom of the semiconductor layer so as to have a gap to one end of each grating electrode, according to one embodiment of the present invention.

To make a surface acoustic wave functional element in the same way as in the case of Example 8, grating electrodes 7 were formed in part under a semiconductor layer 20 as shown in FIG. 24, and an output electrode 27 was formed so that a gap G was provided between the output electrode and the ends of the grating electrodes. Example 18 was arranged so that the width of the grating electrodes, L, and the spacing between them, S, were L=S=λ/6 and that G=λ/4. When the convolution characteristics of the surface acoustic wave functional element of Example 17 were measured in the same way as in the case of Example 7, a good convolution output was obtained from the output electrode, and its efficiency corresponded to −40 dBm. The output electrode of the example causes the interactive parts of the grating and output electrodes to shorten but eliminates the need for intersections, thus facilitating fine work.

Example 19

Using a 36° Y-cut LiTaO$_3$ single-crystal substrate as a piezoelectric substrate, a surface acoustic wave functional element was made in the same way as in the case of Example 11. When the convolution characteristics of the element were measured similarly, a good convolution output was obtained from an output electrode, and its efficiency corresponded to −39 dBm.

As described above, the surface acoustic wave convolvers in the examples attained unprecedentedly high efficiency corresponding to values higher than −40 dBm. Such high efficiency makes it possible to use convolvers in various applications.

INDUSTRIAL APPLICABILITY

In making a surface acoustic wave functional element of the present invention, providing a buffer layer of the present invention on a piezoelectric substrate when a semiconductor layer was grown caused an active layer of excellent film quality to be formed. Disposing the semiconductor layer outside a propagation path for surface acoustic waves minimized surface acoustic wave loss. The width of grating electrodes and the spacing between them formed on the propagation path could be chosen so that reflection of surface acoustic waves were reduced. In addition, forming an output electrode and a ground output electrode which intersect the grating electrodes significantly increased the efficiency of interaction between surface acoustic waves and electrons.

A surface acoustic wave functional element according to the present invention, when applied to a surface acoustic wave amplifier having semiconductors provided with direct-current application electrodes, can attain an unusually high amplification gain at practically low voltage. The element, when applied to a surface acoustic wave convolver, can also attain unprecedentedly high efficiency. In other words, a surface acoustic wave functional element of the present invention radically innovates parts used in portable equipment for mobile communication and alone replaces an amplifier, a filter, or their peripheral circuits. Using a surface acoustic wave convolver according to the present invention as CDMA-related equipment in spread spectrum communication, whose future development is looked forward to, makes it possible to reduce power consumption and increase efficiency at the same time. Taken together, the present invention offers unlimited industrial applicability.

What is claimed is:

1. A surface acoustic wave functional element comprising:
   an input electrode: an output electrode;
   a semiconductor layer provided on a piezoelectric substrate and grating electrodes for conveying a surface acoustic wave to said semiconductor layer, wherein
   said semiconductor layer is situated outside above a propagation path of a surface acoustic wave propagating from said input electrode and said semiconductor layer is composed of an active layer and a buffer layer lattice-matching thereto and a plurality of said grating electrodes are placed on said propagation path perpendicularly to the propagation direction and in a greater width than that of the propagation path.

2. A surface acoustic wave functional element as set forth in claim 1, wherein
   said semiconductor layer is thin enough to prevent the breaking of wire in said grating electrodes.

3. A surface acoustic wave functional element as set forth in claim 2, wherein
   said semiconductor layer is 500 nm thick or less.

4. A surface acoustic wave functional element as set forth in claim 1, wherein one-end portions of said grating electrodes are formed on said semiconductor layer.

5. A surface acoustic wave functional element as set forth in claim 1, comprising a plurality of grating electrodes with their width L satisfying L=$\lambda$/3n (n: positive integer) or L=$\lambda$/2n (n: positive integer) and their inter-electrode space S satisfying S=$\lambda$/3n (n: positive integer) or S=$\lambda$/2n (n: positive integer) for the wavelength $\lambda$ of a surface acoustic wave propagating through said propagation path.

6. A surface acoustic wave functional element as set forth in claim 5, wherein
the width L of said grating electrodes satisfies $\lambda/8 \leq L \leq \lambda$ and the inter-electrode space S satisfies $\lambda/8 \leq S \leq \lambda$.

7. A surface acoustic wave functional element as set forth in claim 5, wherein
the width L of said grating electrodes satisfies L=$\lambda$/6 and the inter-electrode space S satisfies $\lambda$/6.

8. A surface acoustic wave functional element as set forth in claim 1, further comprising:
an electrode for applying a DC electric field to said semiconductor layer.

9. A surface acoustic wave functional element comprising:
an input electrode; a reference signal input electrode; a semiconductor layer provided on a piezoelectric substrate and grating electrodes for conveying a surface acoustic wave to said semiconductor layer, wherein
said semiconductor layer is situated outside above a propagation path of a surface acoustic wave propagating from said input electrode and said reference signal input electrode, said semiconductor layer is composed of an active layer and a buffer layer lattice-matching thereto, a plurality of said grating electrodes are placed on said propagation path perpendicularly to the propagation direction and in a greater width than that of the propagation path, and two input signals propagating from said reference signal input electrode and said input electrode are subjected to convolution so as to be outputted from an output electrode and an output ground electrode.

10. A surface acoustic wave functional element as set forth in claim 9, comprising:
a comb-shaped output electrode so arranged as to cross said grating electrodes and become equal in potential thereto.

11. A surface acoustic wave functional element as set forth in claim 10, wherein
said comb-shaped output electrode is formed above the semiconductor layer.

12. A surface acoustic wave functional element as set forth in claim 10, wherein
said comb-shaped output electrode is formed below the semiconductor layer.

13. A surface acoustic wave functional element as set forth in claim 10, wherein
the grating electrodes above the propagation path differ in electrode period from the grating electrodes formed in alternating above or below the semiconductor layer and the comb-shaped output electrode.

14. A surface acoustic wave functional element as set forth in claim 9, comprising a uniform output electrode at the bottom of said semiconductor layer; and a uniform ground output electrode at the bottom of said piezoelectric substrate.

15. A surface acoustic wave functional element as set forth in claim 10, wherein a comb-shaped ground output electrode is disposed opposite to said grating electrodes and said comb-shaped output electrode.

16. A surface acoustic wave functional element as set forth in claim 15, wherein the electrode width L of an alternating portion of said grating electrodes with a comb-shaped output electrode or a comb-shaped ground output electrode satisfies $\lambda/16 \leq L \leq \lambda/2$ and the inter-electrode space S satisfies $\lambda/16 \leq S \leq \lambda/2$.

17. A surface acoustic wave functional element comprising:
a semiconductor layer; and
a plurality of grating electrodes for conveying a surface acoustic wave to the semiconductor layer provided on a piezoelectric substrate or on a piezoelectric film substrate, wherein
said semiconductor layer is situated outside above a propagation path through which a surface acoustic wave propagates, said grating electrodes are formed perpendicularly to the propagating direction above said semiconductor layer, a strip dielectric film is formed at the top of a portion of the grating electrodes opposed to said semiconductor layer across said propagation path and an output electrode is formed on the strip dielectric film.

18. A surface acoustic wave functional element as set forth in claim 17, wherein
said strip dielectric film is formed at the top and the bottom of said grating electrodes.

19. A surface acoustic wave functional element as set forth in claim 18, wherein
an additional output electrode is formed below the strip dielectric film formed at the bottom of said grating electrodes.

20. A surface acoustic wave functional element as set forth in claim 17, wherein
a uniform output electrode is formed at the bottom of said semiconductor layer.

21. A surface acoustic wave functional element as set forth in claim 17, wherein
said grating electrodes are formed below said semiconductor layer.

22. A surface acoustic wave functional element as set forth in claim 21, wherein
a uniform output electrode is formed at the top of said semiconductor layer.

23. A surface acoustic wave functional element as set forth in claim 17, wherein
said grating electrodes have a structure of lengths in width alternately varied in an appropriate combination and a strip dielectric film is formed at respective one ends of alternate grating electrodes.

24. A surface acoustic wave functional element as set forth in claim 17, wherein a comb-shaped output electrode is formed so as to cross said grating electrodes on said semiconductor layer and become the same potential.

25. A surface acoustic wave functional element as set forth in claim 17, wherein the grating electrodes above the propagation path differ in electrode period from the grating electrodes formed in alternating above or below the semiconductor layer and the comb-shaped electrode.

26. A surface acoustic wave functional element as set forth in claim 17, wherein
the width L of said grating electrodes satisfies $\lambda/8 \leq L \leq \lambda$ and the space S between the grating electrodes satisfies $\lambda/8 \leq S \leq \lambda$.

27. A surface acoustic wave functional element as set forth in claim 17, wherein the width L of said grating electrodes is λ/6 and the space S between the grating electrodes is λ/6.

28. A surface acoustic wave functional element as set forth in claim 17, wherein said semiconductor layer is composed of an active layer and a buffer layer lattice-matching thereto.

29. A surface acoustic wave functional element as set forth in any one of claims 1 and 17, wherein the ratio of the width W of the propagation path for a surface acoustic wave to the width a of the semiconductor layer is determined in such a manner as to almost equate the electric wave impedance of a surface acoustic wave to that of the semiconductor layer.

30. A surface acoustic wave functional element as set forth in any one of claims 1 and 17, wherein the ratio of the width W of said propagation path to the width a of said semiconductor layer satisfies W/a>1.

31. A surface acoustic wave functional element as set forth in any one of claims 1 and 17, wherein the ratio of the width W of said propagation path to the width a of said semiconductor layer satisfies W/a= 8–10.

32. A surface acoustic wave functional element as set forth in any one of claim 1, wherein a semiconductor selected from a group comprising, InAs, InSb, and GaAs is employed for a semiconductor layer.

33. A surface acoustic wave functional element as set forth in any one of claims 1 and 17, wherein a substrate selected from a group comprising $LiNbO_3$ single-crystal substrate, $LiTaO_3$ single-crystal substrate and $KNbO_3$ single-crystal substrate is employed for said piezoelectric substrate.

34. A surface acoustic wave functional element as set forth in any one of claims 1 and 17, wherein a piezoelectric film substrate formed using a film selected from a group comprising $LiNbO_3$ film, $LiTaO_3$ film, $KNbO_3$ film, PZT film and $PbTiO_3$ film is employed for said piezoelectric substrate.

* * * * *